(12) United States Patent
Osada

(10) Patent No.: US 9,590,110 B2
(45) Date of Patent: Mar. 7, 2017

(54) ULTRAVIOLET LIGHT SENSOR CIRCUIT

(71) Applicant: SEMICONDUCTOR ENERGY LABORATORY CO., LTD., Atsugi-shi, Kanagawa-ken (JP)

(72) Inventor: Takeshi Osada, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 174 days.

(21) Appl. No.: 14/476,775

(22) Filed: Sep. 4, 2014

(65) Prior Publication Data

US 2015/0069386 A1 Mar. 12, 2015

(30) Foreign Application Priority Data

Sep. 10, 2013 (JP) ................................. 2013-187041

(51) Int. Cl.
*H01L 29/786* (2006.01)
*H03F 1/30* (2006.01)
*H01L 27/12* (2006.01)

(52) U.S. Cl.
CPC ...... *H01L 29/7869* (2013.01); *H01L 27/1225* (2013.01); *H01L 27/1255* (2013.01); *H03F 1/304* (2013.01)

(58) Field of Classification Search
CPC ..... H01L 29/7869; H03F 1/301; H03F 1/303; H03F 1/304

(Continued)

(56) References Cited

U.S. PATENT DOCUMENTS 5,063,287 A * 11/1991 Trace .................... F02D 35/022
250/214 AG
5,731,856 A 3/1998 Kim et al.
(Continued)

FOREIGN PATENT DOCUMENTS

EP 1737044 A 12/2006
EP 2226847 A 9/2010
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

*Primary Examiner* — William Hernandez
(74) *Attorney, Agent, or Firm* — Nixon Peabody LLP; Jeffrey L. Costellia

(57) ABSTRACT

A sensor circuit with high sensitivity to ultraviolet light. Ultraviolet light is detected using a transistor containing an oxide semiconductor. When the transistor is irradiated with ultraviolet light or light including ultraviolet light, the drain current of the transistor depends on the intensity of the ultraviolet light. Data on the intensity of ultraviolet light is obtained by measuring the drain current of the transistor. Since the band gap of an oxide semiconductor is wider than that of silicon, the sensitivity to light with a wavelength in the ultraviolet region can be increased. Furthermore, an increase in dark current caused by temperature rise in the sensor circuit can be suppressed, resulting in a wider allowable ambient temperature range of the sensor circuit.

10 Claims, 26 Drawing Sheets

(58) Field of Classification Search
USPC .... 257/43; 327/50, 51, 77, 85, 87, 103, 306, 327/514
See application file for complete search history.

(56) References Cited

U.S. PATENT DOCUMENTS

| | | | |
|---|---|---|---|
| 5,734,170 A * | 3/1998 | Ikeda | H03F 3/085 250/205 |
| 5,744,864 A | 4/1998 | Cillessen et al. | |
| 5,969,573 A * | 10/1999 | Koike | H03F 1/303 330/253 |
| 5,981,936 A * | 11/1999 | Fujiie | G11B 7/005 250/214 A |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,372,664 B2 | 2/2013 | Tsuji et al. | |
| 8,426,853 B2 | 4/2013 | Saito et al. | |
| 8,659,941 B2 | 2/2014 | Kamata et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0060562 A1 * | 3/2010 | Hadwen | H01L 31/153 345/102 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2013/0265098 A1 | 10/2013 | Takahashi et al. | |
| 2014/0246667 A1 | 9/2014 | Koyama et al. | |
| 2016/0037095 A1 * | 2/2016 | Wu | H04N 5/359 348/241 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-067331 | 3/2007 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at

(56) References Cited

OTHER PUBLICATIONS

Temperatures Over 1000° C.", Journal of Solid State Chemistry, 1985, vol. 60, pp. 382-384.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Kitzerow.H et al., "Observation of Blue Phases in Chiral Networks", Liquid Crystals, 1993, vol. 14, No. 3, pp. 911-916.
Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m= 7, 8, 9, and 16) in the In2O3—ZnGa2O4—ZnO System", Journal of Solid State Chemistry, Apr. 1, 1995, vol. 116, No. 1, pp. 170-178.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Prins.M et al., "A Ferroelectric Transparent Thin-Film Transistor", Appl. Phys. Lett. (Applies Physics Letters), Jun. 17, 1996, vol. 68, No. 25, pp. 3650-3652.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LCDs", IDW '02 : Proceedings of the 9th International Display Workshops, Dec. 4, 2002, pp. 295-298.
Nomura.K et al., "Thin-Film Transistor Fabricated in Single-Crystalline Transparent Oxide Semiconductor", Science, May 23, 2003, vol. 300, No. 5623, pp. 1269-1272.
Ikeda.T et al., "Full-Functional System Liquid Crystal Display Using Cg-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Lee.H et al., "Current Status of, Challenges to, and Perspective View of AM-OLED", IDW '06 : Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17 22.
Park.S et al., "Challenge to Future Displays: Transparent AM-OLED Driven by PEALD Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phase for Display Application", SID Digest '07 : SID International Symposium Digest of Technical Papers, 2007, vol. 38, pp. 1737-1740.
Miyasaka.M, "SUFTLA Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White TANDEM OLEDS", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09 : Technical Digest of International Electron Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.

(56) References Cited

OTHER PUBLICATIONS

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irridation with Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

* cited by examiner

300

300

ULTRAVIOLET LIGHT SENSOR CIRCUIT

BACKGROUND OF THE INVENTION

1. Field of the Invention

The present invention relates to an object, a method, or a manufacturing method. In addition, the present invention relates to a process, a machine, manufacture, or a composition of matter. In particular, one embodiment of the present invention relates to a semiconductor device, a display device, a light-emitting device, a power storage device, a memory device, a driving method thereof, or a manufacturing method thereof. One embodiment of the present invention relates specifically to a sensor circuit including a semiconductor element.

2. Description of the Related Art

The dose of ultraviolet light reaching the earth's surface is increasing. As a countermeasure against ultraviolet light, there is a movement to install a sensor circuit capable of measuring the dose of ultraviolet light in a portable electronic device, which can be used anywhere. This installation satisfies users' needs of measuring the dose of ultraviolet light in desired places.

Patent Document 1 discloses an ultraviolet light sensor using a silicon photodiode.

REFERENCE

Patent Document 1: Japanese Published Patent Application No. 2007-067331

SUMMARY OF THE INVENTION

To install a sensor circuit capable of measuring the dose of ultraviolet light in a portable electronic device, the sensor circuit needs to be used under a wide range of environmental conditions. Such a sensor circuit used under various environmental conditions can be installed in a variety of electronic devices (including portable electronic devices); that is, the application range of the sensor circuit can be extended.

In Patent Document 1, silicon is used for a photodiode. The band gap of silicon is approximately 1.1 eV. For this reason, the amount of dark current is significantly increased with a rise in temperature, which narrows the temperature range where the ultraviolet light sensor can be used. Moreover, the photodiode has low reliability because it is significantly degraded by continuous ultraviolet irradiation.

The photodiode using silicon has relatively high sensitivity to visible light in many cases. To increase the sensitivity to ultraviolet light, the structure of the photodiode is devised; for example, a filter that selectively transmits ultraviolet light is provided, the thickness of a silicon film is adjusted, or the position of an impurity region is adjusted. Unfortunately, each structure is a factor in increasing the fabrication cost of the sensor circuit for measuring the dose of ultraviolet light.

An object of one embodiment of the present invention is to expand the ambient temperature range, increase the reliability, and/or increase the sensitivity to ultraviolet light. An object of one embodiment of the present invention is to provide a novel configuration, a novel circuit, a novel structure, or a novel driving method. Note that the descriptions of these objects do not disturb the existence of other objects. In one embodiment of the present invention, there is no need to achieve all the objects. Other objects will be apparent from and can be derived from the description of the specification, the drawings, the claims, and the like.

In one embodiment of the present invention, ultraviolet light is detected using a transistor containing an oxide semiconductor. Specifically, when the transistor is irradiated with ultraviolet light or light including ultraviolet light, the drain current of the transistor depends on the intensity of the ultraviolet light. Data on the intensity of ultraviolet light is obtained by measuring the drain current.

The band gap of an oxide semiconductor is wider than that of silicon. For example, the band gap of an IGZO-based oxide semiconductor containing In, Ga, and Zn is approximately 3.2 eV, whereas that of silicon is approximately 1.1 eV. That is, the band gap of an IGZO-based oxide semiconductor is approximately three times as wide as that of silicon. In a sensor circuit using such an oxide semiconductor with a wider band gap than silicon, the optical absorption edge can be positioned on the shorter wavelength side than that in a sensor circuit using silicon. Specifically, when an IGZO-based oxide semiconductor having a band gap of approximately 3.2 eV is used for a sensor circuit, the optical absorption edge is four hundreds and several tens of nanometers; thus, the sensitivity to light with a wavelength in the ultraviolet region can be increased. Furthermore, the use of an oxide semiconductor having a wider band gap than silicon can suppress an increase in dark current caused by temperature rise in the sensor circuit, resulting in a wider range of the allowable ambient temperature of the sensor circuit.

In one embodiment of the present invention, the drain current of a transistor is measured preferably when the transistor is off, when the voltage between a gate and a source (gate-source voltage) of the transistor is lower than the threshold voltage, or when the gate-source voltage of the transistor is negative. However, in the case where a transistor containing an oxide semiconductor is irradiated with light when the transistor is off or when the gate-source voltage of the transistor is lower than the threshold voltage or is negative, the threshold voltage is likely to shift in the negative direction. In view of this, one embodiment of the present invention preferably has a period during which the transistor is on or the gate-source voltage of the transistor is higher than the threshold voltage or is positive. In particular, such a period is preferably provided between periods for detecting ultraviolet light. Such a period can suppress shift of the threshold voltage of the transistor and thus increase the reliability of the transistor.

One embodiment of the present invention includes a transistor, an operational amplifier, and a resistor. The transistor contains an oxide semiconductor. One of a source and a drain of the transistor is electrically connected to a first wiring. A gate of the transistor is electrically connected to a second wiring. A first input terminal of the operational amplifier is electrically connected to a third wiring. A second input terminal of the operational amplifier is electrically connected to the other of the source and the drain of the transistor. A first terminal of the resistor is electrically connected to the second input terminal of the operational amplifier. A second terminal of the resistor is electrically connected to an output terminal of the operational amplifier.

It is possible to expand the ambient temperature range, increase the reliability, and/or increase the sensitivity to ultraviolet light. Moreover, it is possible to provide a novel configuration, a novel circuit, a novel structure, or a novel driving method. Note that one embodiment of the present invention is not limited to having these effects. For example, depending on circumstances or conditions, one embodiment of the present invention may produce another effect or may not produce any of the above effects.

BRIEF DESCRIPTION OF THE DRAWINGS

In the accompanying drawings.

DETAILED DESCRIPTION OF THE INVENTION

Embodiments of the present invention will be described below in detail with reference to the accompanying drawings. Note that the present invention is not limited to the following description, and it is easily understood by those skilled in the art that the mode and details can be variously changed without departing from the spirit and scope of the present invention. Therefore, the present invention should not be construed as being limited to the description of the embodiments below.

Note that a sensor circuit of one embodiment of the present invention can be used in a wide variety of semiconductor devices such as integrated circuits, RF tags, and semiconductor display devices. Semiconductor devices using a sensor circuit are included in the category of one embodiment of the present invention. Integrated circuits include, in their category, large scale integrated circuits (LSI) including a microprocessor, an image processing circuit, a digital signal processor (DSP), a microcontroller, and the like, and programmable logic devices (PLD) such as a field programmable gate array (FPGA) and a complex PLD (CPLD). Semiconductor display devices include, in their category, liquid crystal display devices, light-emitting devices having pixels each provided with a light-emitting element typified by an organic light-emitting diode (OLED), electronic paper, digital micromirror devices (DMD), plasma display panels (PDP), and field emission displays (FED).

Embodiment 1

In this embodiment, a sensor circuit (also referred to as a semiconductor device) of one embodiment of the present invention will be described.

Figure 1:
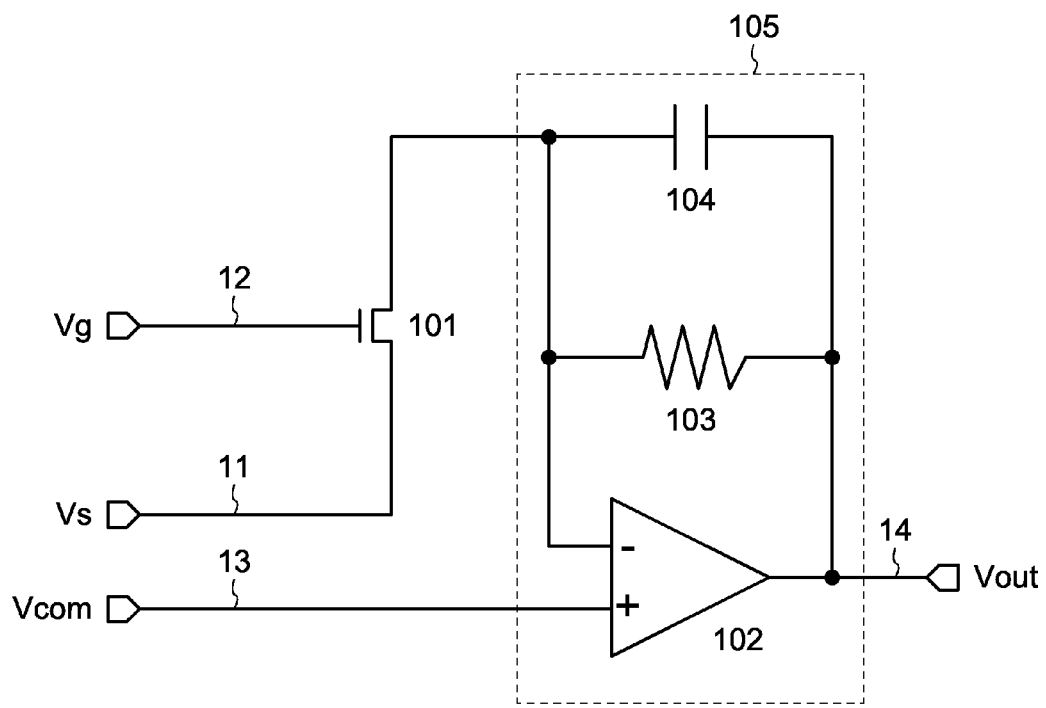
FIG. 1 illustrates a sensor circuit.

First, a configuration example of a sensor circuit in this embodiment will be described with reference to FIG. 1. FIG. 1 is an example of a circuit diagram of the sensor circuit.

The sensor circuit in FIG. 1 includes a transistor 101, an operational amplifier 102, a resistor 103, and a capacitor 104. A first terminal of the transistor 101 is connected to a wiring 11. A gate of the transistor 101 is connected to a wiring 12. A first input terminal (non-inverting input terminal) of the operational amplifier 102 is connected to a wiring 13. A second input terminal (inverting input terminal) of the operational amplifier 102 is connected to a second terminal of the transistor 101. An output terminal of the operational amplifier 102 is connected to a wiring 14. A first terminal of the resistor 103 is connected to the second input terminal of the operational amplifier 102. A second terminal of the resistor 103 is connected to the output terminal of the operational amplifier 102. A first terminal of the capacitor 104 is connected to the second input terminal of the operational amplifier 102. A second terminal of the capacitor 104 is connected to the output terminal of the operational amplifier 102.

Note that the term "connection" in this specification refers to electrical connection and corresponds to the state in which current, voltage, or potential can be supplied or transmitted. Therefore, a connection state means not only a state of direct connection but also a state of electrical connection through a circuit element such as a wiring, a resistor, a diode, or a transistor in which current, voltage, or potential can be supplied or transmitted.

With regard to a transistor in this specification, a first terminal refers to one of a source and a drain and a second terminal refers to the other of the source and the drain. A source of a transistor means a source region included in a semiconductor layer or a source electrode electrically connected to the semiconductor layer. Similarly, a drain of a transistor means a drain region included in a semiconductor layer or a drain electrode electrically connected to the semiconductor layer. A gate of a transistor means a gate electrode.

The transistor 101 has a function of converting ultraviolet light into an electric signal. The transistor 101 can be a transistor containing an oxide semiconductor. The band gap of an oxide semiconductor is wider than that of silicon. For example, the band gap of an IGZO-based oxide semiconductor containing In, Ga, and Zn is approximately 3.2 eV, whereas that of silicon is approximately 1.1 eV. That is, the band gap of an IGZO-based oxide semiconductor is approximately three times as wide as that of silicon. Consequently, the increase in off-state current with a temperature rise can be suppressed in the transistor 101 as compared with a transistor containing silicon.

The operational amplifier 102, the resistor 103, and the capacitor 104 constitute a circuit 105. The circuit 105 has a function of converting current into voltage. For example, the circuit 105 has a function of converting drain current of the transistor 101 into voltage and outputting the voltage to the wiring 14 as a signal Vout.

A signal Vs is input to the wiring 11. The signal Vs has two potentials of Vcom and Vcom−α (α: a positive number). For example, when the signal Vs is a digital signal, a high-level potential of the signal Vs is Vcom and a low-level potential thereof is Vcom−α.

A signal Vg is input to the wiring 12. The signal Vg has two potentials of Vcom+β (β: a positive number) and Vcom−γ (γ>α). For example, when the signal Vg is a digital signal, a high-level potential of the signal Vg is Vcom+β and a low-level potential thereof is Vcom−γ.

The potential Vcom is input to the wiring 13. The potential Vcom is a constant potential.

The signal Vout is output from the wiring 14. The signal Vout is an output signal of the sensor circuit in FIG. 1. The signal Vout has a value depending on the drain current of the transistor 101, that is, a value depending on the intensity of ultraviolet light applied to the transistor 101.

The magnitude relation between Vcom, Vcom−α, Vcom+β, and Vcom−γ is Vcom−γ<Vcom−α<Vcom<Vcom+β.

Note that the amplitude voltage of the signal Vg is higher than that of the signal Vs. The maximum value of the signal Vg is larger than that of the signal Vs, and the minimum value of the signal Vg is smaller than that of the signal Vs.

Note that the threshold voltage of the transistor 101 has a value that is larger than α−γ and smaller than β. Consequently, the transistor 101 is off when the potential of the signal Vs is Vcom−α a and that of the signal Vg is Vcom−γ. The transistor 101 is on when the potential of the signal Vs is Vcom and that of the signal Vg is Vcom+β.

Figure 2:
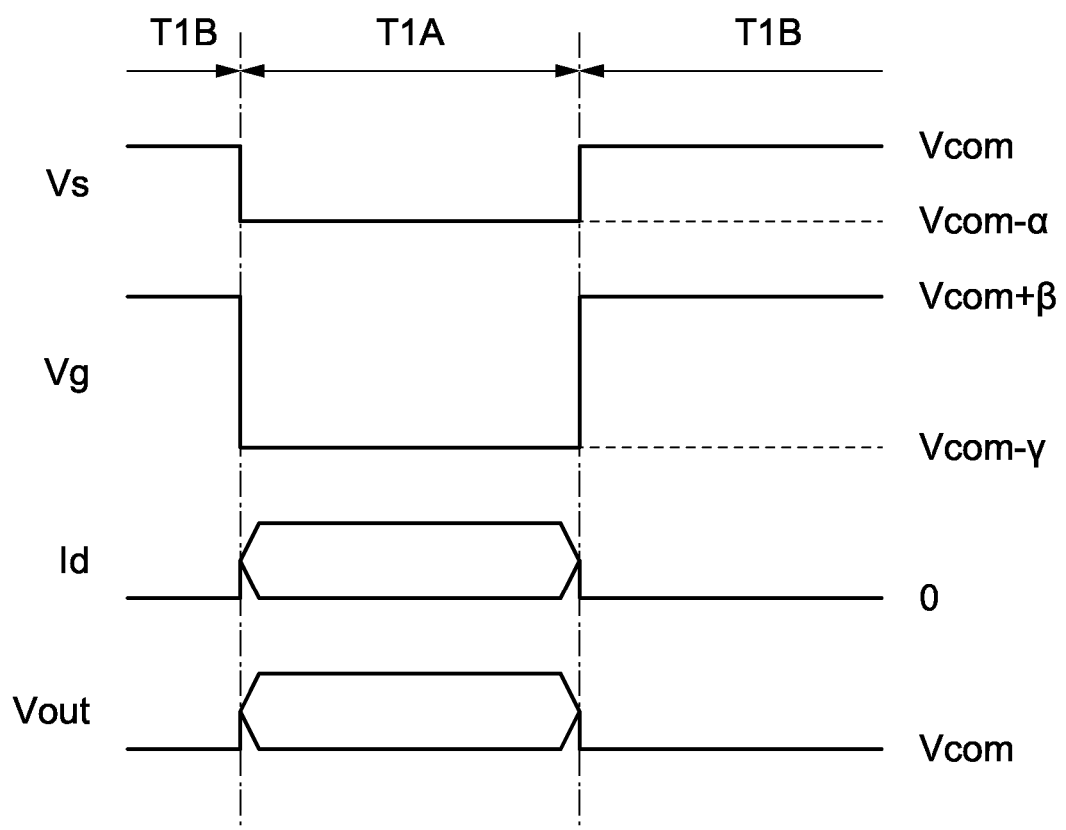
FIG. 2 is a diagram explaining a sensor circuit.

Next, an operation example of the sensor circuit in FIG. 1 will be described with reference to FIG. 2. FIG. 2 is an example of a timing chart applicable to the sensor circuit in FIG. 1. The timing chart in FIG. 2 shows an example of the signal Vs, the signal Vg, a drain current Id of the transistor 101, and the signal Vout.

The sensor circuit in FIG. 1 has two periods of a period T1A and a period T1B. The period T1A is a period during which the sensor circuit operates, and can be referred to as a sensor driving period. The period T1B is a period during which the sensor circuit stops, and can be referred to as a sensor stop period.

In the period T1A, the potential of the signal Vs is Vcom−α and that of the signal Vg is Vcom−γ; thus, the gate-source voltage (Vgs) of the transistor 101 is α−γ, and the transistor 101 is off. The operational amplifier 102 outputs a potential obtained by adding the product of the drain current Id of the transistor 101 and the resistance of the resistor 103 to the potential Vcom, to the wiring 14 as the signal Vout. When the transistor 101 is irradiated with ultraviolet light, the value of the drain current of the transistor 101 depends on the intensity of the ultraviolet light. Thus, the value of the signal Vout also depends on the intensity of the ultraviolet light.

In the period T1B, the potential of the signal Vs is Vcom, and that of the signal Vg is Vcom+β; thus, Vgs of the transistor 101 is β, and the transistor 101 is on. The operational amplifier 102 makes the potential of the wiring 14 and the potential of the second terminal of the transistor 101 equal to the potential Vcom supplied to the wiring 13. Consequently, the voltage between the source and the drain of the transistor 101 is 0, and the drain current of the transistor 101 is 0.

In the sensor circuit in FIG. 1, shift of the threshold voltage of the transistor 101 can be suppressed. This feature is specifically described below. In the period T1A, Vgs of the transistor 101 is negative; therefore, the threshold voltage of the transistor 101 shifts in the negative direction particularly when the transistor 101 is irradiated with light. On the other hand, in the period T1B, Vgs of the transistor 101 is positive; thus, the threshold voltage of the transistor 101 shifts in the positive direction. Accordingly, continuous shift of the threshold voltage of the transistor 101 in the negative direction can be prevented. Furthermore, the threshold voltage of the transistor 101 that has shifted in the negative direction in the period T1A shifts in the positive direction in the period T1B, whereby the threshold voltage can return to the value before shifting in the negative direction.

Next, the feature of low power consumption of the sensor circuit in FIG. 1 is specifically described. In the period T1B, the potentials of the first and second terminals of the transistor 101 are set at Vcom; thus, the drain current of the transistor 101 is 0, and power consumption is not increased.

The sensor circuit in FIG. 1 achieves both suppression of threshold voltage shift of the transistor 101 and power consumption reduction as described above.

The capacitor 104 in the sensor circuit of FIG. 1 enables the potential of the signal Vout to be stable; thus, the resolution can be increased.

Note that the circuit 105 is not limited to having the configuration in FIG. 1 as long as it has at least one of the above functions. For example, a variable resistor may be connected between the second terminal of the transistor 101 and the node of the second input terminal of the operational amplifier 102, the first terminal of the resistor 103, and the first terminal of the capacitor 104.

As the area of a channel region of the transistor 101 becomes larger, the light sensitivity of the transistor 101 can be increased. For this reason, the channel width of the transistor 101 is preferably larger than that of at least one or each of transistors included in the operational amplifier 102.

Note that the capacitor 104 may be omitted, in which case the number of elements or parts can be reduced.

Note that an element having a resistance component, a diode, or a transistor may be used instead of the resistor 103. An element having a resistance component is connected between the second input terminal and the output terminal of the operational amplifier 102. A diode is connected between the second input terminal and the output terminal of the operational amplifier 102 so that an anode of the diode is connected to the output terminal of the operational amplifier 102. In the case of using a transistor, a first terminal is connected to the second input terminal of the operational amplifier 102, and a second terminal is connected to the output terminal of the operational amplifier 102. In particular, when the transistor is an n-channel transistor, the gate is preferably connected to the output terminal of the operational amplifier 102. In contrast, when the transistor is a p-channel transistor, the gate is preferably connected to the second input terminal of the operational amplifier 102. Alternatively, the gate of the transistor may be connected to the wiring 11, the wiring 12, the wiring 13, or any other wiring.

Note that the circuit 105 may be omitted, in which case an output signal of the sensor circuit is the drain current of the transistor 101.

When the circuit 105 is omitted, the sensor circuit preferably includes a means or a circuit for setting the potential of the second terminal of the transistor 101 at Vcom. An example of the means and the circuit is a switch having a first terminal connected to the wiring 11 or the wiring 13 and a second terminal connected to the second terminal of the transistor 101. Note that the sensor circuit may include a means or a circuit for setting the potential of the second terminal of the transistor 101 at Vcom even when the circuit 105 is not omitted.

The signal Vs may have a potential other than Vcom and Vcom−α.

The signal Vg may have a potential other than Vcom+β and Vcom−γ.

A signal having Vcom may be input to the wiring 13.

It is possible that the potential Vcom is input to the wiring 11 and a signal having Vcom and a potential higher than Vcom is input to the wiring 13. In this case, the potential of the signal input to the wiring 13 is preferably the potential higher than Vcom in the period T1A and Vcom in the period T1B.

Note that this embodiment can be combined with any of the matters disclosed in this specification and the like as appropriate.

Embodiment 2

In this embodiment, a sensor circuit of one embodiment of the present invention will be described.

Figure 3:
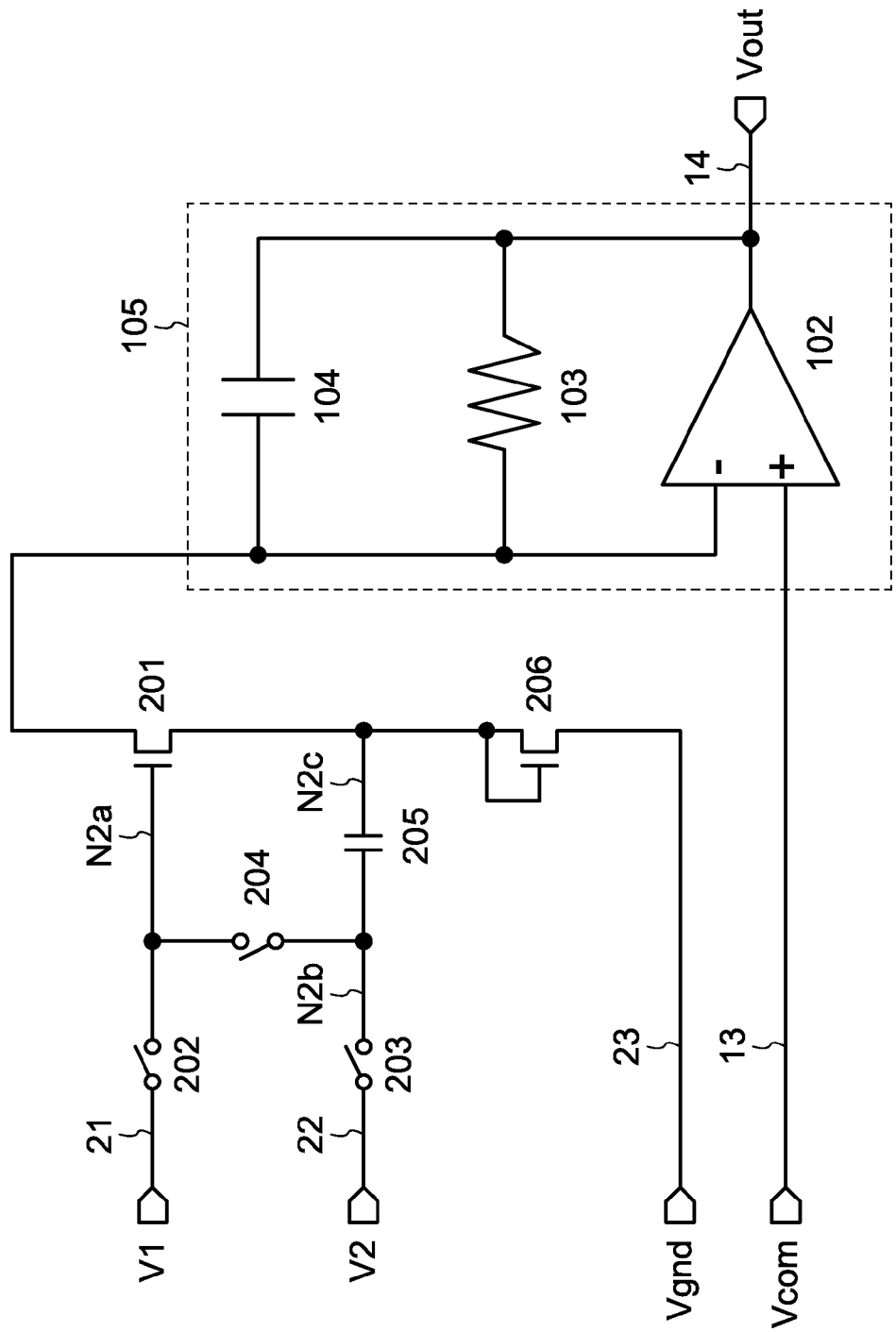
FIG. 3 illustrates a sensor circuit.

First, a configuration example of a sensor circuit in this embodiment will be described with reference to FIG. 3. FIG. 3 is an example of a circuit diagram of the sensor circuit.

The sensor circuit in FIG. 3 includes a transistor 201, a switch 202, a switch 203, a switch 204, a capacitor 205, a transistor 206, and the circuit 105. A first terminal of the transistor 201 is connected to the circuit 105. A first terminal of the switch 202 is connected to a wiring 21. A second terminal of the switch 202 is connected to a gate of the transistor 201. A first terminal of the switch 203 is connected to a wiring 22. A first terminal of the switch 204 is connected to the gate of the transistor 201. A second terminal of the switch 204 is connected to a second terminal of the switch 203. A first terminal of the capacitor 205 is connected to the second terminal of the switch 203. A second terminal of the capacitor 205 is connected to a second terminal of the transistor 201. A first terminal of the transistor 206 is connected to a wiring 23. A second terminal and a gate of the transistor 206 are connected to the second terminal of the transistor 201.

Note that a portion where the gate of the transistor 201, the second terminal of the switch 202, and the first terminal of the switch 204 are connected is denoted by a node N2a. A portion where the second terminal of the switch 203, the second terminal of the switch 204, and the first terminal of the capacitor 205 are connected is denoted by a node N2b. A portion where the second terminal of the transistor 201, the second terminal of the capacitor 205, and the second terminal of the transistor 206 are connected is denoted by a node N2c.

The transistor 201 corresponds to the transistor 101.

The switch 202 has a function of controlling continuity between the wiring 21 and the node N2a.

The switch 203 has a function of controlling continuity between the wiring 22 and the node N2b.

The switch 204 has a function of controlling continuity between the node N2a and the node N2b.

The capacitor 205 has a function of holding a potential difference between the node N2b and the node N2c.

The transistor 206 functions as a resistor between the wiring 23 and the node N2c or as a current source.

A potential V1 is input to the wiring 21. The potential V1 is a constant potential.

A potential V2 is input to the wiring 22. The potential V2 is a constant potential.

A potential Vgnd is input to the wiring 23. The potential Vgnd is a constant potential.

The magnitude relation between V1 and V2 is V1>V2.

Figure 4:
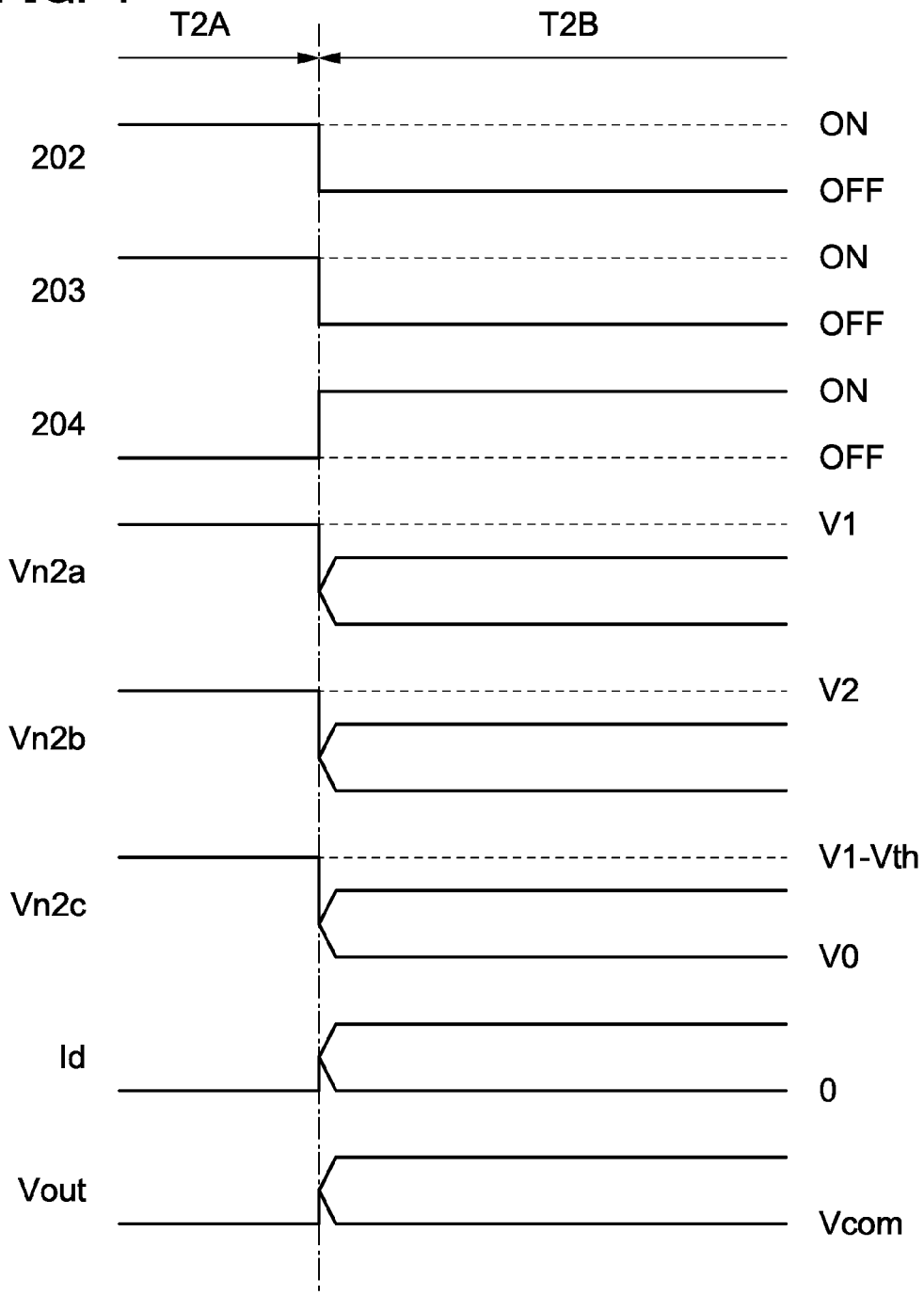
FIG. 4 is a diagram explaining a sensor circuit.

Next, an operation example of the sensor circuit in FIG. 3 will be described with reference to FIG. 4. FIG. 4 is an example of a timing chart applicable to the sensor circuit in FIG. 3. The timing chart in FIG. 4 shows an example of the timing of turning on or off the switches 202 to 204, a potential Vn2a of the node N2a, a potential Vn2b of the node N2b, a potential Vn2c of the node N2c, a drain current Id of the transistor 201, and the signal Vout.

The sensor circuit in FIG. 3 has two periods of a period T2A and a period T2B. The period T2A is a period for obtaining the threshold voltage of the transistor 201, and can be referred to as a threshold voltage acquisition period. The period T2B is a period for outputting a signal corresponding to ultraviolet light applied to the transistor 201.

In the period T2A, the switch 202 is on, the switch 203 is on, and the switch 204 is off. The potential of the node N2a is the potential V1 because V1 is supplied to the node N2a through the switch 202. The potential of the node N2b is the potential V2 because V2 is supplied to the node N2b through the switch 203. The potential of the node N2c is V1−Vth because Vgs of the transistor 201 becomes the threshold voltage (Vth) of the transistor 201. A potential difference between the node N2b and the node N2c is held at the capacitor 205.

In the period T2B, the switch 202 is off, the switch 203 is off, and the switch 204 is on. The potentials of the node N2a and the node N2b are the same because continuity is established between the node N2a and the node N2b through the switch 204. Here, the following assumptions are made for convenience: the capacitance of the capacitor 205 is sufficiently larger than the gate capacitance of the transistor 201, and the potentials of the node N2a and the node N2b are V2. The potential of the node N2c is V1−Vth because the potential difference between the node N2b and the node N2c in the period T2A is maintained by the capacitor 205. Since the potential of the node N2a is V2 and that of the node N2c is V1−Vth, Vgs of the transistor 201 is expressed by V2−(V1−Vth)=Vth−(V1−V2). That is, Vgs of the transistor 201 is lower than the threshold voltage of the transistor 201 by V1−V2. The operational amplifier 102 outputs a potential obtained by adding the product of the drain current Id of the transistor 201 and the resistance of the resistor 103 to the potential Vcom, to the wiring 14 as the signal Vout. When the transistor 201 is irradiated with ultraviolet light, the value of the drain current of the transistor 201 depends on the intensity of the ultraviolet light. That is, the value of the signal Vout also depends on the intensity of the ultraviolet light.

The potential of the node N2c varies depending on the drain current of the transistor 201. Note that Vgs of the transistor 201 is kept at Vth−(V1−V2) because the potential difference between the node N2b and the node N2c in the period T2A is maintained by the capacitor 205.

The sensor circuit in FIG. 3 is less adversely affected by a fluctuation of the threshold voltage of the transistor 201 or variations in the threshold voltage of the transistors 201.

Note that an element having a resistance component or a resistor may be used instead of the transistor 206. An element having a resistance component is connected between the wiring 23 and the node N2c. A resistor is connected between the wiring 23 and the node N2c.

Note that the gate of the transistor 206 may be connected to the wiring 21, the wiring 22, the wiring 13, the wiring 14, or any other wiring. Alternatively, the gate of the transistor 206 may be connected to the second terminal of the transistor 201.

A signal having Vgnd may be input to the wiring 23. Specifically, a signal having two potentials of Vgnd and Vcom may be input to the wiring 23. When the potential of the signal is set at Vcom, the drain current of the transistor 201 becomes 0; thus, power consumption can be reduced.

A signal having V1 may be input to the wiring 21.

A signal having V2 may be input to the wiring 22.

A signal having Vcom may be input to the wiring 13. Specifically, a signal having two potentials of Vcom and Vgnd may be input to the wiring 13. When the potential of the signal is set at Vgnd, the drain current of the transistor 201 becomes 0; thus, power consumption can be reduced.

The channel width of the transistor 201 is preferably larger than that of the transistor 206. When transistors are used as the switches 202 to 204, the channel width of the transistor 201 is preferably larger than that of the transistors used as these switches.

Note that this embodiment can be combined with any of the matters disclosed in this specification and the like as appropriate.

Embodiment 3

In this embodiment, a sensor circuit of one embodiment of the present invention will be described.

Figure 5:
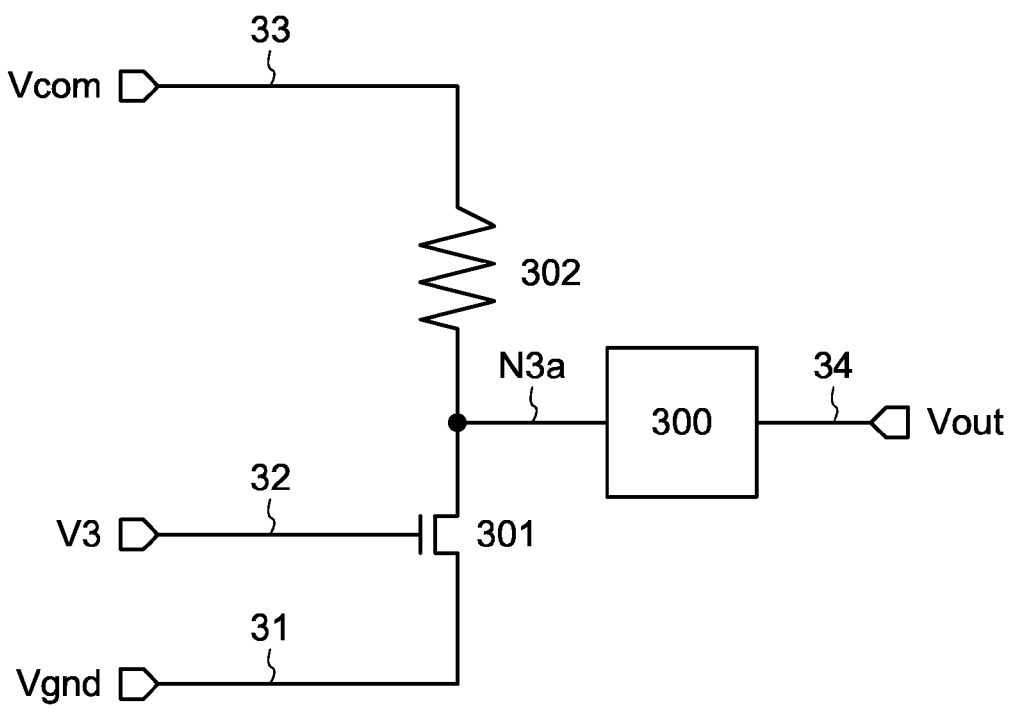
FIG. 5 illustrates a sensor circuit.

First, a configuration example of a sensor circuit in this embodiment will be described with reference to FIG. 5. FIG. 5 is an example of a circuit diagram of the sensor circuit.

The sensor circuit in FIG. 5 includes a circuit 300, a transistor 301, and a resistor 302. A first terminal of the transistor 301 is connected to a wiring 31. A gate of the transistor 301 is connected to a wiring 32. A first terminal of the resistor 302 is connected to a wiring 33. A second terminal of the resistor 302 is connected to a second terminal of the transistor 301. An input terminal of the circuit 300 is connected to the second terminal of the transistor 301. An output terminal of the circuit 300 is connected to a wiring 34.

A portion where the input terminal of the circuit 300, the second terminal of the transistor 301, and the second terminal of the resistor 302 are connected is denoted by a node N3a.

The potential Vgnd is input to the wiring 31.

A potential V3 is input to the wiring 32. The potential V3 is a constant potential.

The potential Vcom is input to the wiring 33.

The signal Vout is output from the wiring 34.

The magnitude relation between Vgnd, V3, and Vcom is V3<Vgnd<Vcom. It is particularly preferable that V3−Vgnd be lower than the threshold voltage of the transistor 301.

The transistor 301 corresponds to the transistor 101.

The circuit 300 has a function of outputting a potential corresponding to the potential of the node N3a to the wiring 34. Alternatively, the circuit 300 functions as an analog buffer circuit.

Next, an operation example of the sensor circuit in FIG. 5 will be described.

The potential of the node N3a is a potential obtained by subtracting the product of the drain current of the transistor 301 and the resistance of the resistor 302 from the potential Vcom. Then, the circuit 300 outputs a potential corresponding to the potential of the node N3a to the wiring 34 as the signal Vout. When the transistor 301 is irradiated with ultraviolet light, the value of the drain current of the transistor 301 depends on the intensity of ultraviolet light applied to the transistor 301. Thus, the values of the potential of the node N3a and the signal Vout also depend on the intensity of ultraviolet light applied to the transistor 301.

The sensor circuit in FIG. 5 can output a voltage corresponding to ultraviolet light applied to the transistor 301, without using a large-scale current-voltage converter circuit.

Figure 6A:
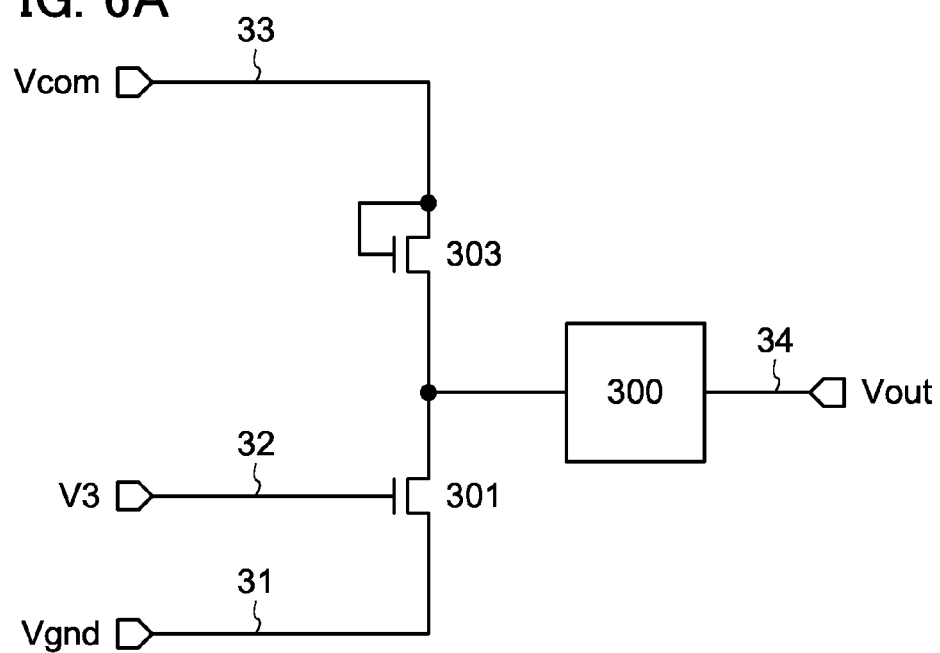
FIGS. 6A and 6B each illustrate a sensor circuit.
Figure 6B:
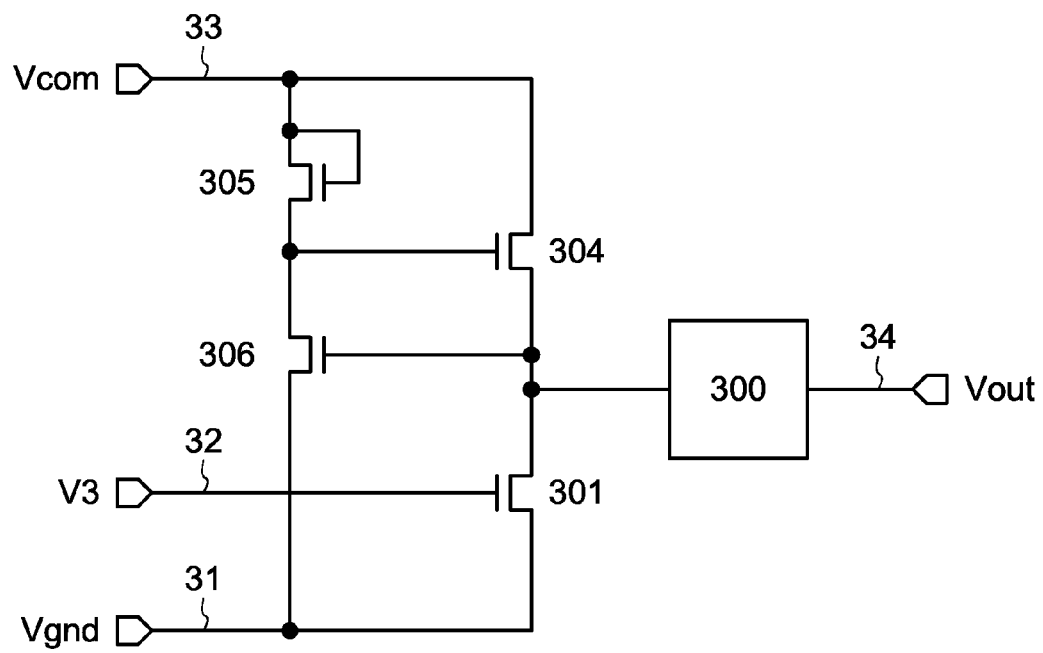

Like the sensor circuit in FIG. 5, sensor circuits illustrated in FIGS. 6A and 6B can output the signal Vout corresponding to the intensity of ultraviolet light applied to the transistor 301.

The sensor circuit in FIG. 6A has a configuration where the resistor 302 in the sensor circuit of FIG. 5 is replaced with a transistor 303. A first terminal of the transistor 303 is connected to the wiring 33. A second terminal of the transistor 303 is connected to the second terminal of the transistor 301. A gate of the transistor 303 is connected to the wiring 33.

The sensor circuit in FIG. 6B includes the circuit 300, the transistor 301, a transistor 304, a transistor 305, and a transistor 306. The first terminal of the transistor 301 is connected to the wiring 31. The gate of the transistor 301 is connected to the wiring 32. A first terminal of the transistor 304 is connected to the wiring 33. A second terminal of the transistor 304 is connected to the second terminal of the transistor 301. A first terminal of the transistor 305 is connected to the wiring 33. A second terminal of the transistor 305 is connected to the gate of the transistor 304. A gate of the transistor 305 is connected to the wiring 33. A first terminal of the transistor 306 is connected to the wiring 31. A second terminal of the transistor 306 is connected to the gate of the transistor 304. A gate of the transistor 306 is connected to the second terminal of the transistor 301. The input terminal of the circuit 300 is connected to the second terminal of the transistor 301. The output terminal of the circuit 300 is connected to the wiring 34.

Note that the circuit 300 may be omitted.

A signal having Vgnd may be input to the wiring 31. Specifically, a signal having two potentials of Vgnd and Vcom may be input to the wiring 31. Setting the potential of the signal at Vcom makes the drain current of the transistor 301 zero, whereby power consumption can be reduced.

A signal having V3 may be input to the wiring 32. Specifically, a signal having two potentials of V3 and a potential higher than Vgnd may be input to the wiring 32. Setting the potential of the signal at a potential higher than Vgnd suppresses shift of the threshold voltage of the transistor 301. Note that the signal may have Vcom instead of the potential higher than Vgnd.

A signal having Vcom may be input to the wiring 33. Specifically, a signal having two potentials of Vcom and Vgnd may be input to the wiring 33. Setting the potential of the signal at Vgnd makes the drain current of the transistor 301 zero, so that power consumption can be reduced.

Figure 7A:
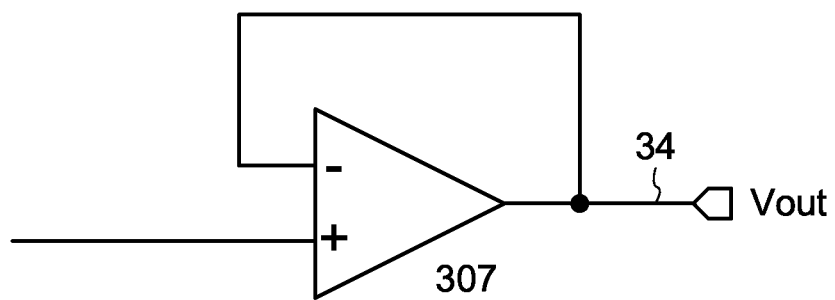
FIGS. 7A and 7B each illustrate a sensor circuit.
Figure 7B:
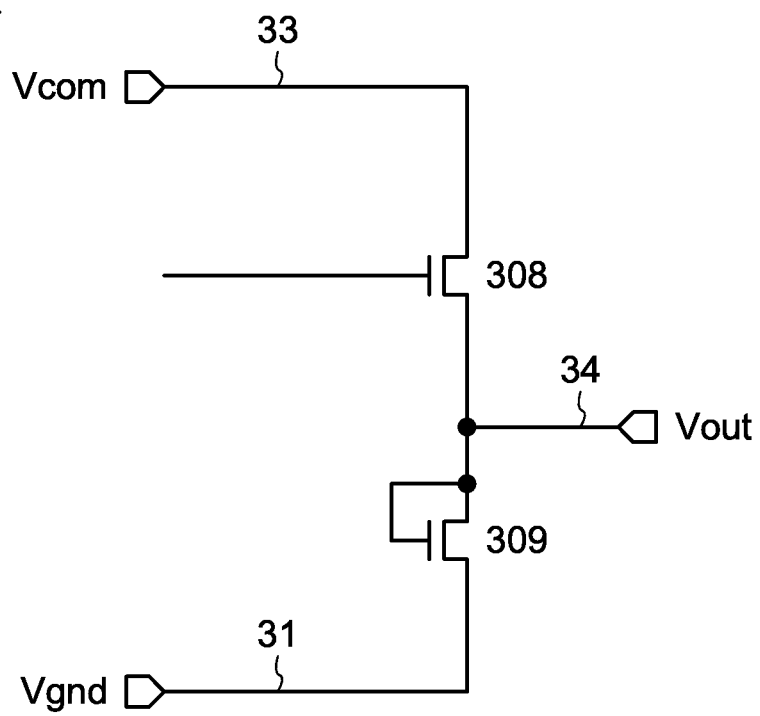

The circuit 300 can have configurations illustrated in FIGS. 7A and 7B.

The circuit 300 in FIG. 7A includes an operational amplifier 307. A first input terminal (non-inverting input terminal) of the operational amplifier 307 is connected to the second terminal of the transistor 301. A second input terminal (inverting input terminal) and an output terminal of the operational amplifier 307 are connected to the wiring 34.

The circuit 300 in FIG. 7B includes a transistor 308 and a transistor 309. A first terminal of the transistor 308 is connected to the wiring 33. A second terminal of the transistor 308 is connected to the wiring 34. A gate of the transistor 308 is connected to the second terminal of the transistor 301. A first terminal of the transistor 309 is connected to the wiring 31. A second terminal and a gate of the transistor 309 are connected to the wiring 34.

Note that this embodiment can be combined with any of the matters disclosed in this specification and the like as appropriate.

Embodiment 4

In this embodiment, a sensor circuit of one embodiment of the present invention will be described.

Figure 8:
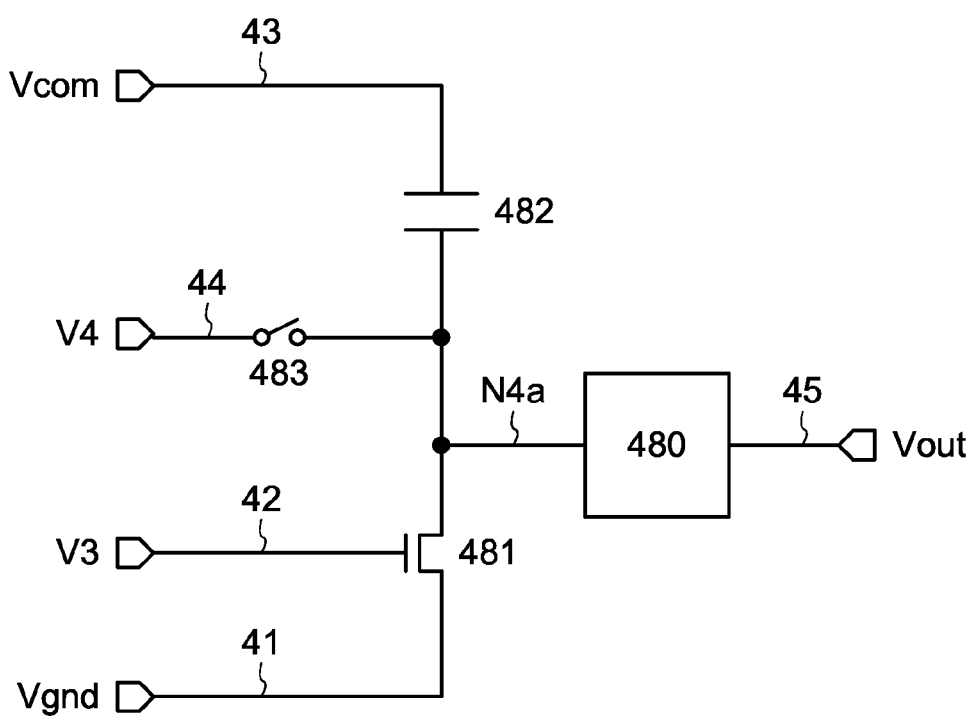
FIG. 8 illustrates a sensor circuit.

First, a configuration example of a sensor circuit in this embodiment will be described with reference to FIG. 8. FIG. 8 is an example of a circuit diagram of the sensor circuit.

The sensor circuit in FIG. 8 includes a circuit 480, a transistor 481, a capacitor 482, and a switch 483. A first terminal of the transistor 481 is connected to a wiring 41. A gate of the transistor 481 is connected to a wiring 42. A first terminal of the capacitor 482 is connected to a wiring 43. A second terminal of the capacitor 482 is connected to a second terminal of the transistor 481. A first terminal of the switch 483 is connected to a wiring 44. A second terminal of the switch 483 is connected to the second terminal of the transistor 481. An input terminal of the circuit 480 is connected to the second terminal of the transistor 481. An output terminal of the circuit 480 is connected to a wiring 45.

A portion where the input terminal of the circuit 480, the second terminal of the transistor 481, the second terminal of the capacitor 482, and the second terminal of the switch 483 are connected is denoted by a node N4a.

The potential Vgnd is input to the wiring 41.
The potential V3 is input to the wiring 42.
The potential Vcom is input to the wiring 43.
A potential V4 is input to the wiring 44. The potential V4 is a constant potential.
The signal Vout is output from the wiring 45.
The circuit 480 corresponds to the circuit 300.
The transistor 481 corresponds to the transistor 101.
The capacitor 482 has a function of holding a potential difference between the wiring 43 and the node N4a.
The switch 483 has a function of controlling continuity between the wiring 44 and the second terminal of the transistor 481.

Next, the operation of the sensor circuit in FIG. 8 will be described.

First, the switch 483 is turned on, and the potential of the node N4a becomes the potential V4 because V4 is supplied to the node N4a through the switch 483. Then, the switch 483 is turned off; consequently, the potential of the node N4a decreases depending on the drain current of the transistor 481. Then, the circuit 480 outputs a potential corresponding to the potential of the node N4a to the wiring 45 as the signal Vout. When the transistor 481 is irradiated with ultraviolet light, the value of the drain current of the transistor 481 depends on the intensity of ultraviolet light applied to the transistor 481. Thus, the values of the potential of the node N4a and the signal Vout also depend on the intensity of ultraviolet light applied to the transistor 481.

The sensor circuit in FIG. 8 can output a voltage corresponding to ultraviolet light applied to the transistor 481, without using a large-scale current-voltage converter circuit.

Note that the circuit 480 may be omitted.

A signal having Vgnd may be input to the wiring 41. Specifically, a signal having two potentials of Vgnd and V4 may be input to the wiring 41. By setting the potential of the signal at V4 and turning on the switch 483, the drain current of the transistor 481 can be made zero. Thus, power consumption can be reduced.

A signal having V3 may be input to the wiring 42. Specifically, a signal having two potentials of V3 and a potential higher than Vgnd may be input to the wiring 42. Setting the potential of the signal at a potential higher than Vgnd suppresses shift of the threshold voltage of the transistor 481. Note that the signal may have Vcom or V4 instead of the potential higher than Vgnd.

A signal having Vcom may be input to the wiring 43.

A signal having V4 may be input to the wiring 44. Specifically, a signal having two potentials of V4 and Vgnd may be input to the wiring 44. Setting the potential of the signal at Vgnd makes the drain current of the transistor 481 zero, whereby power consumption can be reduced.

Note that this embodiment can be combined with any of the matters disclosed in this specification and the like as appropriate.

Embodiment 5

In this embodiment, a sensor circuit of one embodiment of the present invention will be described.

Figure 9:
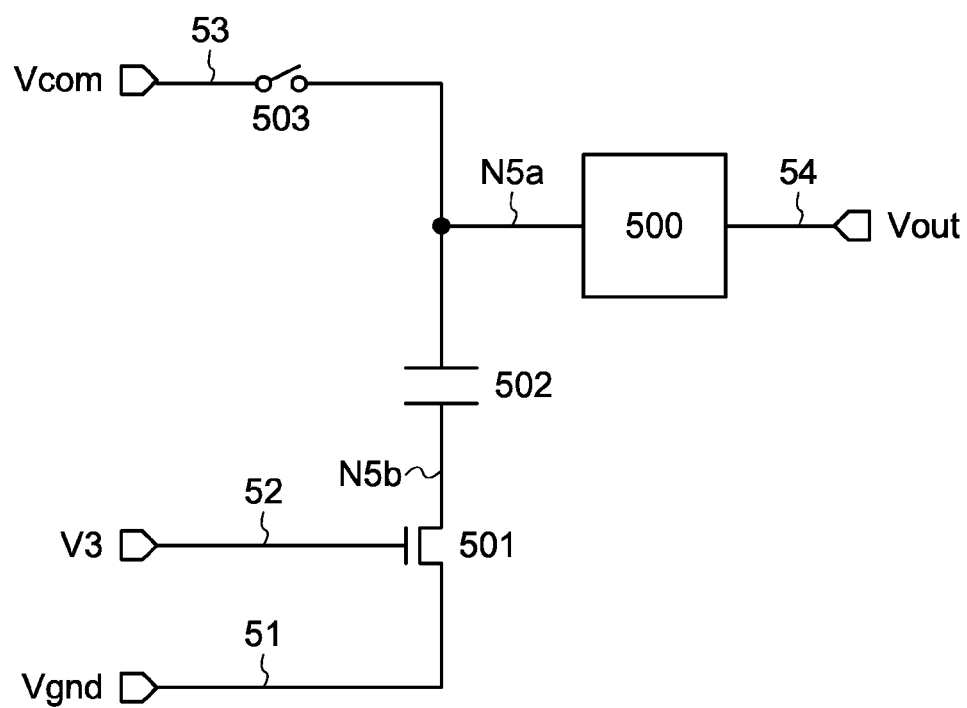
FIG. 9 illustrates a sensor circuit.

First, a configuration example of a sensor circuit in this embodiment will be described with reference to FIG. 9. FIG. 9 is an example of a circuit diagram of the sensor circuit.

The sensor circuit in FIG. 9 includes a circuit 500, a transistor 501, a capacitor 502, and a switch 503. A first terminal of the transistor 501 is connected to a wiring 51. A gate of the transistor 501 is connected to a wiring 52. A first terminal of the capacitor 502 is connected to a second terminal of the transistor 501. A first terminal of the switch 503 is connected to a wiring 53. A second terminal of the switch 503 is connected to a second terminal of the capacitor 502. An input terminal of the circuit 500 is connected to the second terminal of the capacitor 502. An output terminal of the circuit 500 is connected to a wiring 54.

A portion where the input terminal of the circuit 500, the second terminal of the capacitor 502, and the second terminal of the switch 503 are connected is denoted by a node N5a. A portion where the second terminal of the transistor 501 and the first terminal of the capacitor 502 are connected is denoted by a node N5b.

The potential Vgnd is input to the wiring 51.
The potential V3 is input to the wiring 52.
The potential Vcom is input to the wiring 53.
The signal Vout is output from the wiring 54.
The circuit 500 corresponds to the circuit 300.
The transistor 501 corresponds to the transistor 101.
The capacitor 502 has a function of holding a potential difference between the node N5a and the node N5b.
The switch 503 has a function of controlling continuity between the wiring 53 and the node N5a.

Next, the operation of the sensor circuit in FIG. 9 will be described.

First, the switch 503 is turned on, and the potential of the node N5a becomes the potential Vcom because Vcom is input to the second terminal of the capacitor 502 through the switch 503. The capacitor 502 holds a potential difference between the node N5a and the node N5b at the time when the switch 503 is on. Then, the switch 503 is turned off, so that the node N5b becomes floating. The potential of the node N5b decreases depending on the drain current of the transistor 501. Thus, the potential of the node N5a decreases depending on the potential of the node N5b because the capacitor 502 holds the potential difference between the node N5a and the node N5b. The circuit 500 outputs a potential corresponding to the potential of the node N5a to the wiring 54 as the signal Vout. When the transistor 501 is irradiated with ultraviolet light, the value of the drain current of the transistor 501 depends on the intensity of ultraviolet light applied to the transistor 501. Thus, the values of the potentials of the node N5a and the node N5b and the signal Vout also depend on the intensity of ultraviolet light applied to the transistor 501.

The sensor circuit in FIG. 9 can output a voltage corresponding to ultraviolet light applied to the transistor 501, without using a large-scale current-voltage converter circuit.

Note that the circuit 500 may be omitted.

A signal having Vgnd may be input to the wiring 51.

A signal having V3 may be input to the wiring 52. Specifically, a signal having two potentials of V3 and a potential higher than Vgnd may be input to the wiring 52. Setting the potential of the signal at a potential higher than Vgnd suppresses shift of the threshold voltage of the transistor 501. Note that the signal may have Vcom instead of the potential higher than Vgnd.

A signal having Vcom may be input to the wiring 53.

Note that this embodiment can be combined with any of the matters disclosed in this specification and the like as appropriate.

Embodiment 6

In this embodiment, an analog-to-digital converter (A/D converter or ADC) of one embodiment of the present invention will be described. An A/D converter in this embodiment can be used for the sensor circuits described in Embodiments 1 to 5 of this specification.

Figure 10:
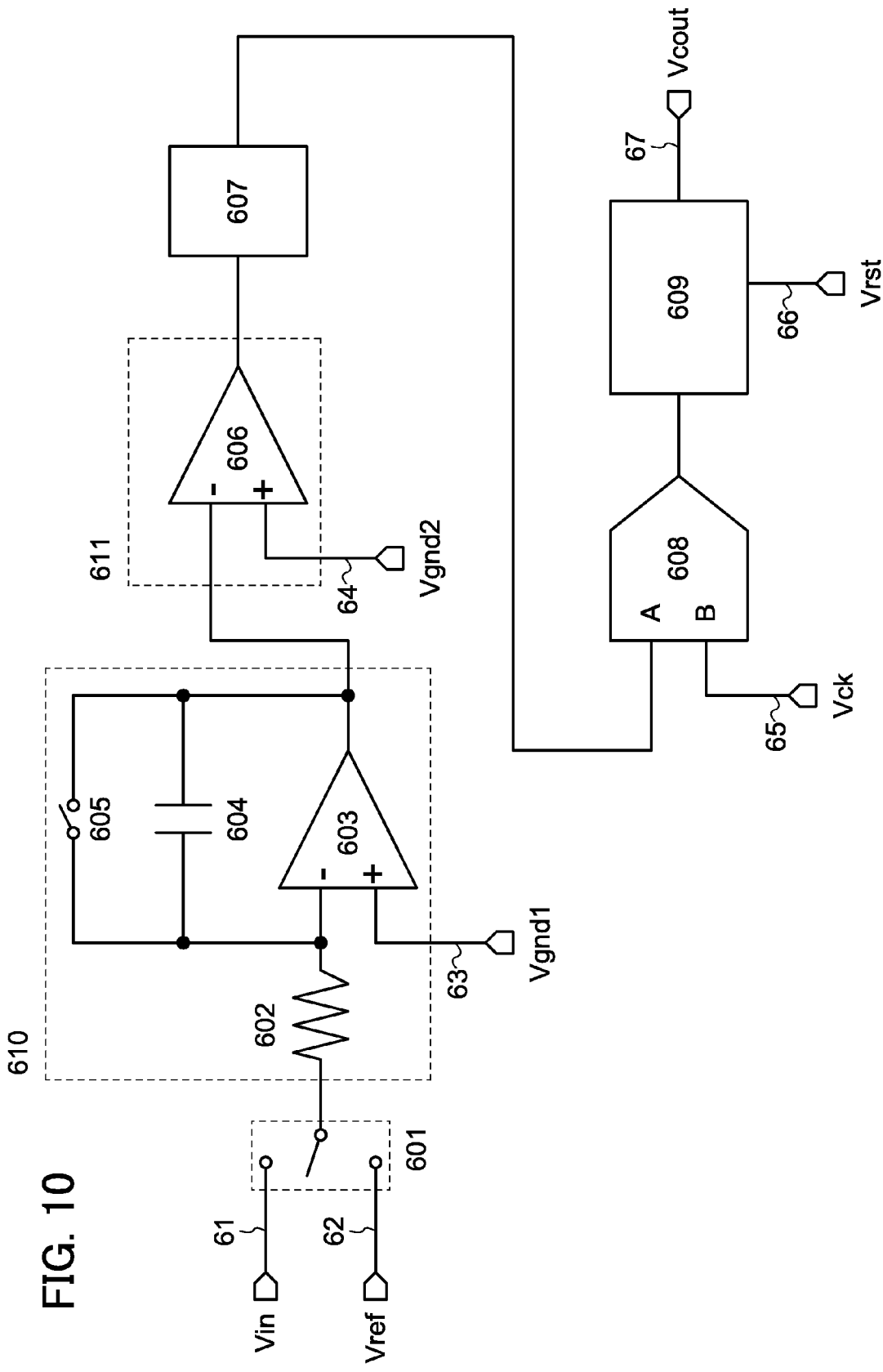
FIG. 10 illustrates an A/D converter circuit.

First, a configuration example of the A/D converter in this embodiment will be described with reference to FIG. 10. FIG. 10 is an example of a circuit diagram of the A/D converter in this embodiment.

The A/D converter in FIG. 10 includes a circuit 601, a resistor 602, an operational amplifier 603, a capacitor 604, a switch 605, an operational amplifier 606, a circuit 607, an AND circuit 608, and a counter circuit 609. The circuit 601 is connected to a wiring 61, a wiring 62, and a first terminal of the resistor 602. A first input terminal (non-inverting input terminal) of the operational amplifier 603 is connected to a wiring 63. A second input terminal (inverting input terminal) of the operational amplifier 603 is connected to a second terminal of the resistor 602. A first terminal of the capacitor 604 is connected to the second input terminal of the operational amplifier 603. A second terminal of the capacitor 604 is connected to an output terminal of the operational amplifier 603. A first terminal of the switch 605 is connected to the second input terminal of the operational amplifier 603. A second terminal of the switch 605 is connected to the output terminal of the operational amplifier 603. A first input terminal (non-inverting input terminal) of the operational amplifier 606 is connected to a wiring 64. A second input terminal (inverting input terminal) of the operational amplifier 606 is connected to the output terminal of the operational amplifier 603. A first input terminal (A terminal) of the AND circuit 608 is connected to an output terminal of the operational amplifier 606 through the circuit 607.

A second input terminal (B terminal) of the AND circuit 608 is connected to a wiring 65. The counter circuit 609 is connected to an output terminal of the AND circuit 608, a wiring 66, and a wiring 67.

A signal Vin is input to the wiring 61. The signal Vin corresponds to the signal Vout described in Embodiments 1 to 5. That is, the value of the signal Vin depends on the intensity of ultraviolet light.

A potential Vref is input to the wiring 62. The potential Vref is a constant potential.

A potential Vgnd1 is input to the wiring 63. The potential Vgnd1 is a constant potential.

A potential Vgnd2 (Vgnd2<Vgnd1) is input to the wiring 64. The potential Vgnd2 is a constant potential.

A clock signal Vck is input to the wiring 65.

A reset signal Vrst is input to the wiring 66.

A signal Vcout is output from the wiring 67.

The circuit 601 has functions of controlling continuity between the wiring 61 and the first terminal of the resistor 602 and controlling continuity between the wiring 62 and the first terminal of the resistor 602. That is, the circuit 601 has a function of establishing continuity between the first terminal of the resistor 602 and one of the wirings 61 and 62.

The resistor 602, the operational amplifier 603, the capacitor 604, and the switch 605 constitute a circuit 610. The circuit 610 has a function of outputting a potential with a waveform equivalent to the time integral of the waveform of an input potential; that is, the circuit 610 functions as an integrator.

The operational amplifier 606 forms a circuit 611. The circuit 611 has a function of comparing two input potentials and switching an output depending on which of the two input potentials is higher; that is, the circuit 611 functions as a comparator.

The circuit 607 has functions of outputting a signal similar to an input signal and outputting a low-level or high-level signal regardless of an input signal. A signal similar to an input signal includes the same signal as the input signal and an output signal of a logic circuit, such as an inverter circuit, to which the input signal is input.

Figure 11:
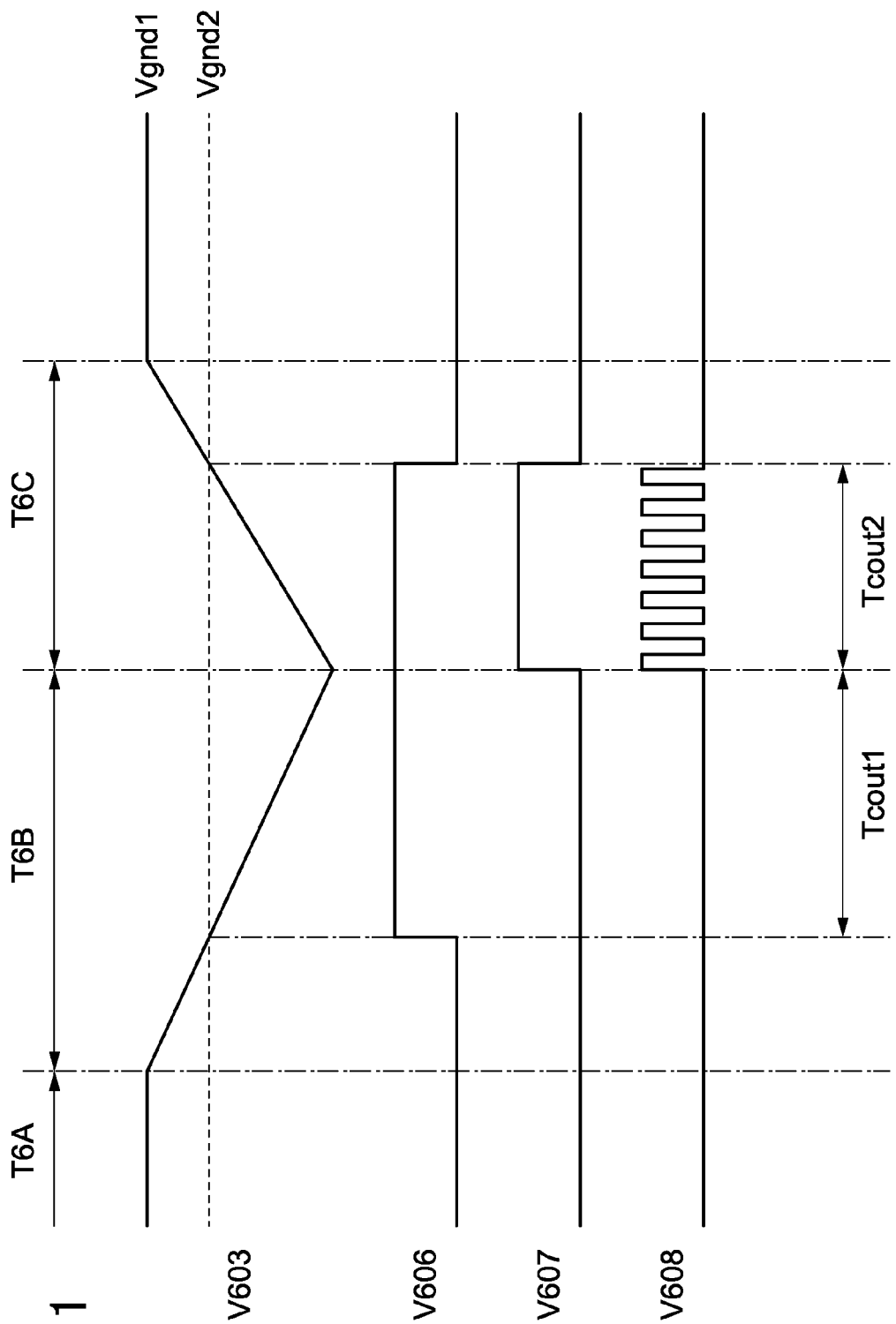
FIG. 11 is a diagram explaining an A/D converter circuit.

Next, an operation example of the A/D converter in FIG. 10 will be described with reference to FIG. 11. FIG. 11 is an example of a timing chart applicable to the A/D converter in FIG. 10. The timing chart in FIG. 11 shows an output signal V603 of the operational amplifier 603, an output signal V606 of the operational amplifier 606, an output signal V607 of the circuit 607, and an output signal V608 of the AND circuit 608.

The A/D converter in FIG. 10 has a period T6A, a period T6B, and a period T6C.

In the period T6A, the switch 605 is on; thus, electric charge in the capacitor 604 is released, and the potentials of the output terminal and the second input terminal of the operational amplifier 603 become Vgnd1.

Since the potential of the output terminal of the operational amplifier 603 is Vgnd1 (Vgnd1>Vgnd2), an output signal of the operational amplifier 606 is at low level.

Since the output signal of the operational amplifier 606 is at low level, an output signal of the circuit 607 is at low level. Alternatively, the output signal of the circuit 607 is at low level regardless of the output signal of the operational amplifier 606.

Since the output signal of the circuit 607 is at low level, an output signal of the AND circuit 608 is at low level.

Since the output signal of the AND circuit 608 is at low level, the counter circuit 609 does not count pulses of the clock signal Vck.

Note that the circuit 601 may establish continuity between the first terminal of the resistor 602 and the wiring 61 or between the first terminal of the resistor 602 and the wiring 62, or may break continuity between the first terminal of the resistor 602 and both of the wirings 61 and 62.

In the period T6B, the switch 605 is off.

Continuity between the first terminal of the resistor 602 and the wiring 61 is established by the circuit 601.

The output signal of the operational amplifier 603 starts to decrease from Vgnd1 because the signal Vin is supplied to the first terminal of the resistor 602 through the circuit 601. The slope of the output signal of the operational amplifier 603 depends on the signal Vin. For example, the slope of the output signal of the operational amplifier 603 becomes steeper as the potential of the signal Vin is lower.

The output signal of the operational amplifier 606 is inverted from low level to high level when the potential of the output signal of the operational amplifier 603 falls below Vgnd2. A period Tcout1 is a period from the time when the output signal of the operational amplifier 606 is inverted from low level to high level until the end of the period T6B.

The output signal of the circuit 607 is at low level regardless of the output signal of the operational amplifier 606.

Since the output signal of the circuit 607 is at low level, an output signal of the AND circuit 608 is at low level.

Since the output signal of the AND circuit 608 is at low level, the counter circuit 609 does not count pulses of the clock signal Vck.

The period Tcout1 lasts for a predetermined time; thus, at the end of the period T6B, the output signal of the operational amplifier 603 has a value depending on the signal Vin. Specifically, the potential of the output signal of the operational amplifier 603 at the end of the period T6B becomes lower as the potential of the signal Vin is lower.

In the period T6C, the switch 605 is off.

Continuity between the first terminal of the resistor 602 and the wiring 62 is established by the circuit 601.

The output signal of the operational amplifier 603 starts to increase from the potential at the end of the period T6B or the start of the period T6C because the potential Vref is supplied to the first terminal of the resistor 602 through the circuit 601.

The output signal of the operational amplifier 606 is inverted from high level to low level when the potential of the output signal of the operational amplifier 603 exceeds Vgnd2. A period Tcout2 is a period from the start of the period T6C until the time when the output signal of the operational amplifier 606 is inverted from high level to low level.

The circuit 607 outputs a signal similar to the output signal of the operational amplifier 606. That is, the output signal of the circuit 607 is at high level in the period Tcout2 and is at low level after the end of the period Tcout2.

An output signal of the AND circuit 608 is the clock signal Vck in the period Tcout2, and is at low level after the end of the period Tcout2.

The counter circuit 609 counts pulses of the clock signal Vck in the period Tcout2, and does not count pulses of the clock signal Vck after the end of the period Tcout2. The counter circuit 609 outputs, as the signal Vcout, the count of the clock signal Vck in the period Tcout2.

The A/D converter in FIG. 10 is capable of converting the signal Vin into the signal Vcout. The signal Vin corresponds to the signal Vout and has a value depending on the intensity of ultraviolet light. That is, the signal Vcout has a value depending on the intensity of ultraviolet light.

Figure 12:
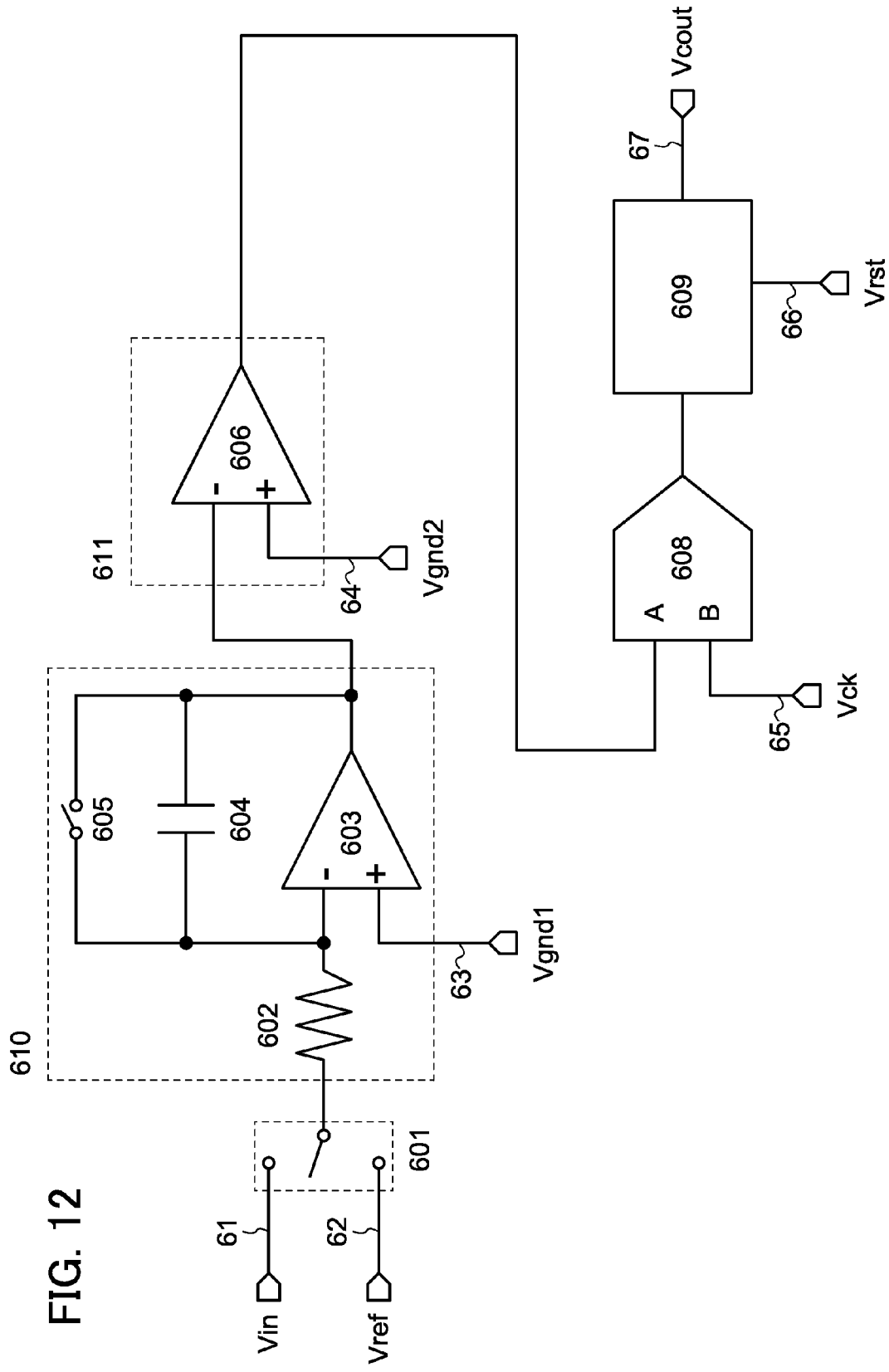
FIG. 12 illustrates an A/D converter circuit.

Note that the circuit 607 may be omitted as illustrated in FIG. 12. In the A/D converter of FIG. 12, the output terminal of the operational amplifier 606 is connected to the first input terminal (A terminal) of the AND circuit 608. The operation of the A/D converter in FIG. 12 differs from that of the A/D converter in FIG. 10, for example, in that the AND circuit 608 outputs the clock signal Vck in the period Tcout1, that the counter circuit 609 counts pulses of the clock signal Vck in the period Tcout1, and that the count in the counter circuit 609 is reset by the reset signal Vrst at the end of the period T6B or the start of the period T6C.

Figure 13:
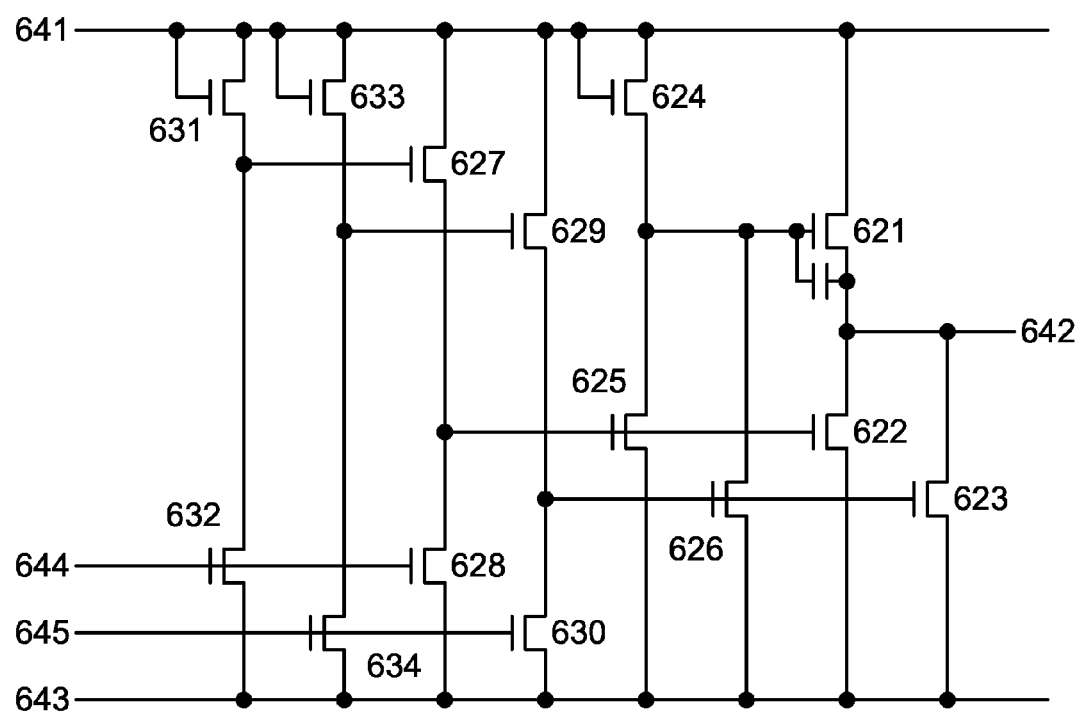
FIG. 13 illustrates an AND circuit.

As the AND circuit 608, a circuit in FIG. 13 may be used. The circuit in FIG. 13 includes transistors 621 to 634. The transistors 621 to 634 can be transistors containing an oxide semiconductor. A first terminal of the transistor 621 is connected to a wiring 641. A second terminal of the transistor 621 is connected to a wiring 642. A first terminal of the transistor 622 is connected to a wiring 643. A second terminal of the transistor 622 is connected to the wiring 642. A first terminal of the transistor 623 is connected to the wiring 643. A second terminal of the transistor 623 is connected to the wiring 642. A first terminal of the transistor 624 is connected to the wiring 641. A second terminal of the transistor 624 is connected to a gate of the transistor 621. A gate of the transistor 624 is connected to the wiring 641. A first terminal of the transistor 625 is connected to the wiring 643. A second terminal of the transistor 625 is connected to the gate of the transistor 621. A gate of the transistor 625 is connected to a gate of the transistor 622. A first terminal of the transistor 626 is connected to the wiring 643. A second terminal of the transistor 626 is connected to the gate of the transistor 621. A gate of the transistor 626 is connected to a gate of the transistor 623. A first terminal of the transistor 627 is connected to the wiring 641. A second terminal of the transistor 627 is connected to the gate of the transistor 622. A first terminal of the transistor 628 is connected to the wiring 643. A second terminal of the transistor 628 is connected to the gate of the transistor 622. A gate of the transistor 628 is connected to a wiring 644. A first terminal of the transistor 629 is connected to the wiring 641. A second terminal of the transistor 629 is connected to the gate of the transistor 623. A first terminal of the transistor 630 is connected to the wiring 643. A second terminal of the transistor 630 is connected to the gate of the transistor 623. A gate of the transistor 630 is connected to a wiring 645. A first terminal of the transistor 631 is connected to the wiring 641. A second terminal of the transistor 631 is connected to a gate of the transistor 627. A gate of the transistor 631 is connected to the wiring 641. A first terminal of the transistor 632 is connected to the wiring 643. A second terminal of the transistor 632 is connected to the gate of the transistor 627. A gate of the transistor 632 is connected to the wiring 644. A first terminal of the transistor 633 is connected to the wiring 641. A second terminal of the transistor 633 is connected to a gate of the transistor 629. A gate of the transistor 633 is connected to the wiring 641. A first terminal of the transistor 634 is connected to the wiring 643. A second terminal of the transistor 634 is connected to the gate of the transistor 629. A gate of the transistor 634 is connected to the wiring 645. The wiring 644, the wiring 645, and the wiring 642 correspond to the first input terminal, the second input terminal, and the output terminal, respectively, of the AND circuit. Appropriate potentials can be input to the wirings 641 and 643.

Figure 14:
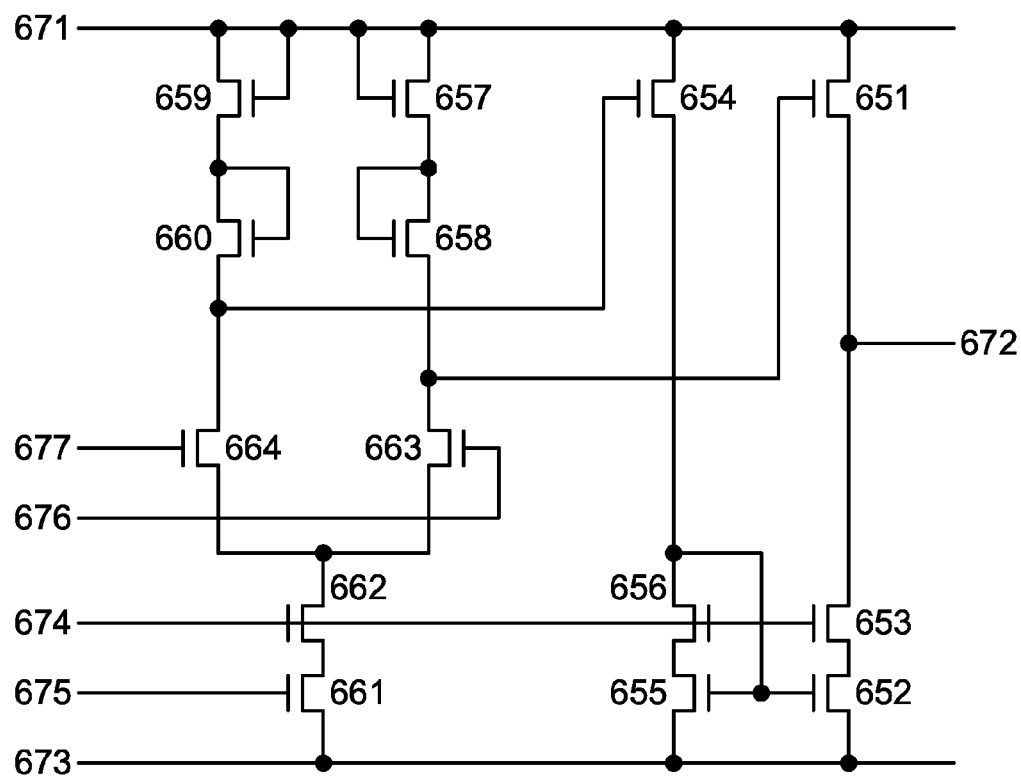
FIG. 14 illustrates an operational amplifier.

As the operational amplifier 102, the operational amplifier 603, the operational amplifier 606, or the like, a circuit in FIG. 14 may be used. The circuit in FIG. 14 includes transistors 651 to 664. The transistors 651 to 664 can be transistors containing an oxide semiconductor. A first terminal of the transistor 651 is connected to a wiring 671. A second terminal of the transistor 651 is connected to a wiring 672. A first terminal of the transistor 652 is connected to a wiring 673. A first terminal of the transistor 653 is connected to a second terminal of the transistor 652. A second terminal of the transistor 653 is connected to the wiring 672. A gate of the transistor 653 is connected to a wiring 674. A first terminal of the transistor 654 is connected to the wiring 671. A second terminal of the transistor 654 is connected to a gate of the transistor 652. A first terminal of the transistor 655 is connected to the wiring 673. A gate of the transistor 655 is connected to the gate of the transistor 652. A first terminal of the transistor 656 is connected to a second terminal of the transistor 655. A second terminal of the transistor 656 is connected to the second terminal of the transistor 654. A gate of the transistor 656 is connected to the wiring 674. A first terminal and a gate of the transistor 657 are connected to the wiring 671. A first terminal and a gate of the transistor 658 are connected to a second terminal of the transistor 657. A second terminal of the transistor 658 is connected to the gate of the transistor 651. A first terminal and a gate of the transistor 659 are connected to the wiring 671. A first terminal and a gate of the transistor 660 are connected to a second terminal of the transistor 659. A second terminal of the transistor 660 is connected to the gate of the transistor 654. A first terminal of the transistor 661 is connected to the wiring 673. A gate of the transistor 661 is connected to a wiring 675. A first terminal of the transistor 662 is connected to a second terminal of the transistor 661. A gate of the transistor 662 is connected to the wiring 674. A first terminal of the transistor 663 is connected to a second terminal of the transistor 662. A second terminal of the transistor 663 is connected to the gate of the transistor 651. A gate of the transistor 663 is connected to a wiring 676. A first terminal of the transistor 664 is connected to the second terminal of the transistor 662. A second terminal of the transistor 664 is connected to the gate of the transistor 654. A gate of the transistor 664 is connected to a wiring 677. The wiring 677, the wiring 676, and the wiring 672 correspond to the first input terminal (non-inverting input terminal), the second input terminal (inverting input terminal), and the output terminal, respectively, of the operational amplifier. Appropriate potentials can be input to the respective wirings 671, 673, 674, and 675.

Note that this embodiment can be combined with any of the matters disclosed in this specification and the like as appropriate.

Embodiment 7

In this embodiment, a sensor circuit of one embodiment of the present invention will be described.

Figure 15:
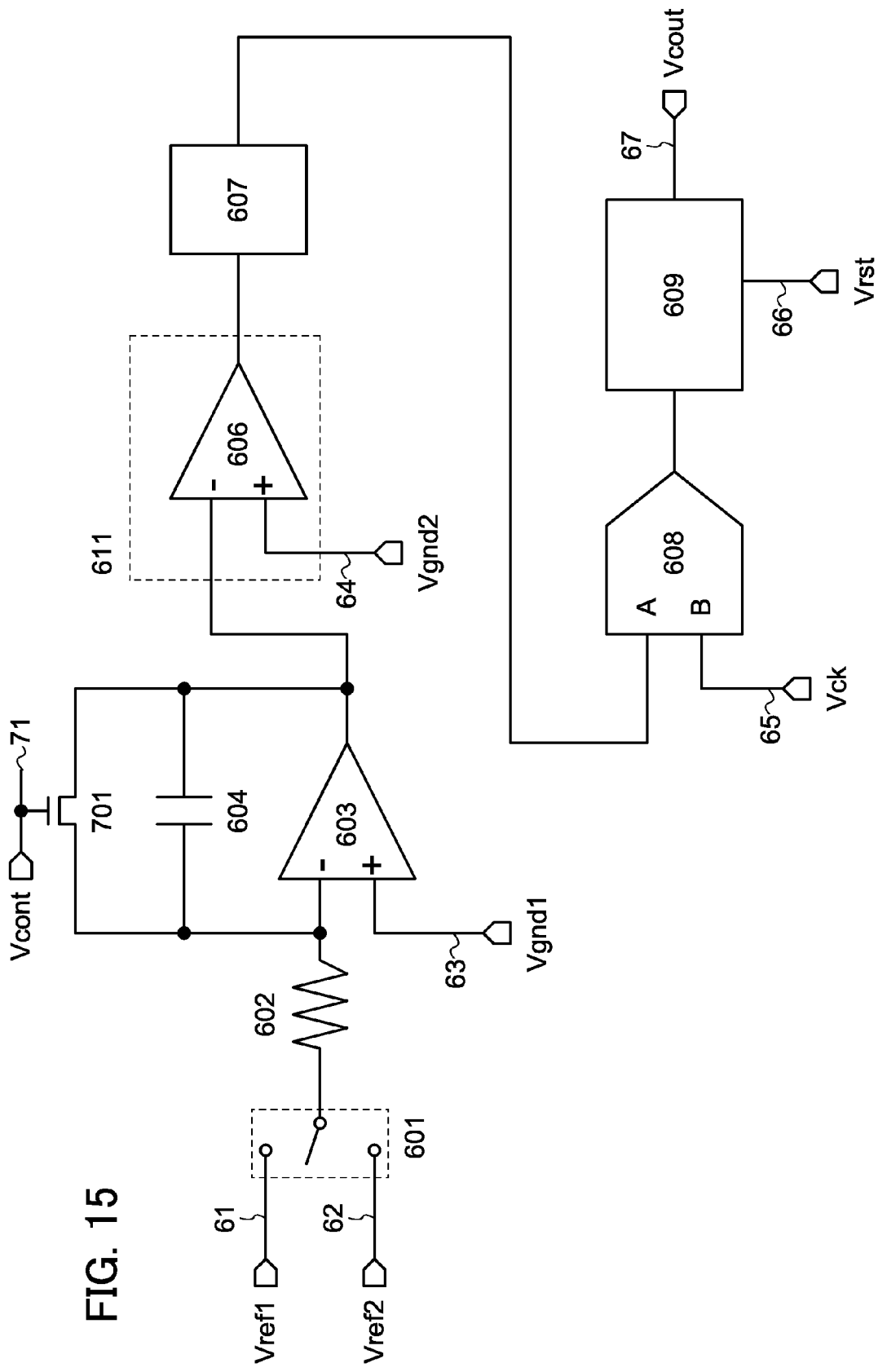
FIG. 15 illustrates a sensor circuit.

A configuration of a sensor circuit in this embodiment will be described with reference to FIG. 15. FIG. 15 is an example of a circuit diagram of the sensor circuit in this embodiment.

The sensor circuit in FIG. 15 is different from the A/D converter in FIG. 10 in that a transistor 701 is used instead of the switch 605, that a potential Vref1 is input to the wiring 61, and that a potential Vref2 is input to the wiring 62. A first terminal of the transistor 701 is connected to the second input terminal the operational amplifier 603. A second terminal of the transistor 701 is connected to the output terminal of the operational amplifier 603. A gate of the transistor 701 is connected to a wiring 71. The potential Vref1 and the potential Vref2 are constant potentials. A signal Vcont is input to the wiring 71. The signal Vcont is a signal for controlling the on/off state of the transistor 701.

The transistor 701 corresponds to the transistor 101.

Next, an example of the operation of the sensor circuit in FIG. 15 will be described.

In the period T6A, the transistor 701 is on.

In the period T6B, the transistor 701 is off.

In the period T6C, the transistor 701 is off, and ultraviolet light is applied to the transistor 701. Thus, the slope of an output signal of the operational amplifier 603 varies depending on the intensity of ultraviolet light applied to the transistor 701. In other words, the length of the period Tcout2 and the potential of the signal Vcout depend on the intensity of ultraviolet light applied to the transistor 701.

Note that in the sensor circuit of FIG. 15, the period Tcout1 ranges preferably from 10 ms to 1000 ms, more preferably from 20 ms to 800 ms, still more preferably from 30 ms to 500 ms.

Note that this embodiment can be combined with any of the matters disclosed in this specification and the like as appropriate.

Embodiment 8

In this embodiment, a semiconductor device of one embodiment of the present invention will be described.

Figure 16:
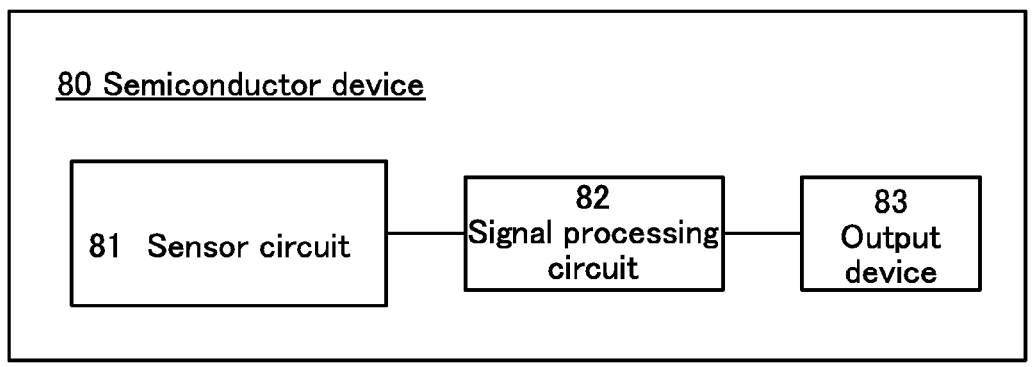
FIG. 16 illustrates a semiconductor device.

A semiconductor device 80 in FIG. 16 includes a sensor circuit 81, a signal processing circuit 82, and an output device 83. The sensor circuit 81 corresponds to the sensor circuit described in any of Embodiments 1 to 5.

The signal Vout of the sensor circuit 81 is input to the signal processing circuit 82. By using the signal Vout, the signal processing circuit 82 generates a signal for controlling the operation of the output device 83. Specific examples of the signal for controlling the operation of the output device 83 are a signal for making the output device 83 output data on the intensity of ultraviolet light included in the signal Vout, and a signal for changing the operation of the output device 83 in accordance with data on the intensity of ultraviolet light included in the signal Vout.

Specific examples of the output device 83 include a display device, a lighting device, a printer, a plotter, and an audio output device. For example, when a display device is used as the output device 83, data on the intensity of ultraviolet light can be displayed on the display device. When a lighting device such as a mercury lamp is used as the output device 83 and the intensity of ultraviolet light emitted from the lighting device decreases, the intensity of ultraviolet light emitted from the lighting device can be adjusted by using data on the intensity of ultraviolet light obtained from the sensor circuit 81.

Figure 17:
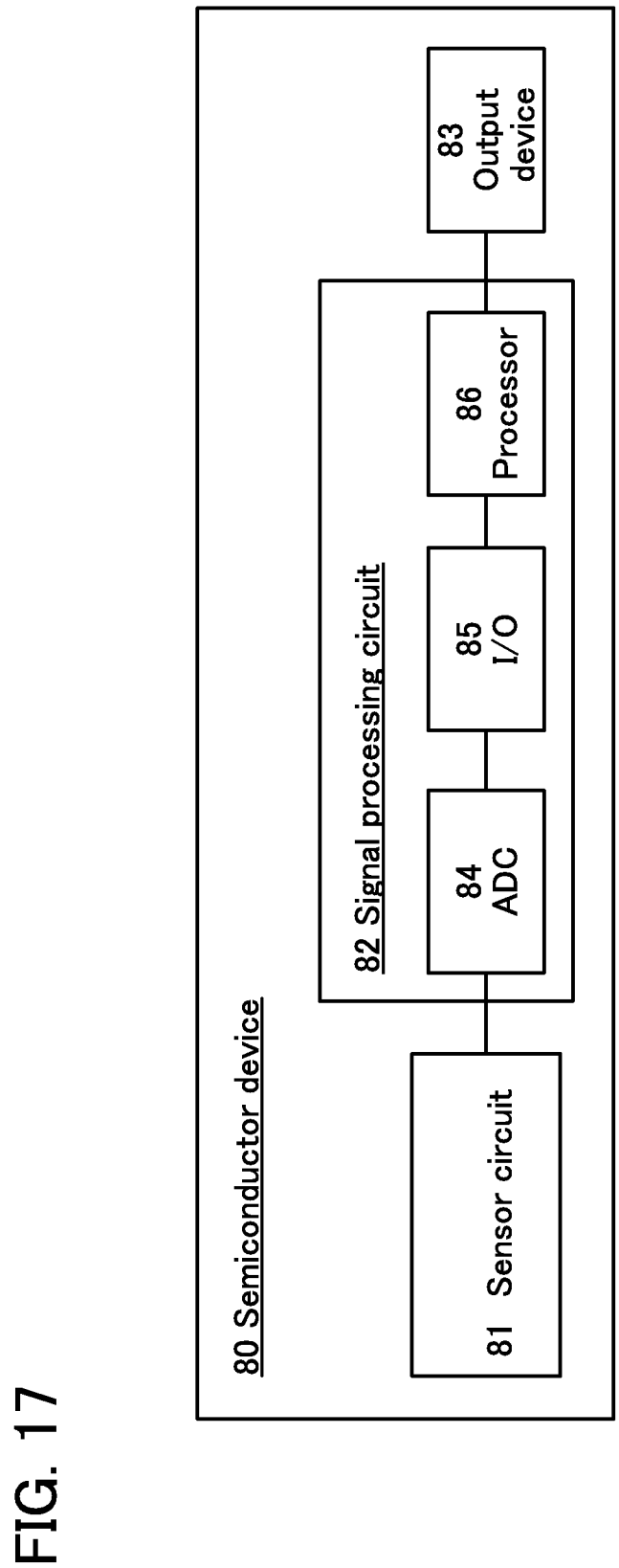
FIG. 17 illustrates a semiconductor device.

FIG. 17 illustrates an example of a specific configuration of the semiconductor device 80 illustrated in FIG. 16.

Like the semiconductor device 80 in FIG. 16, the semiconductor device 80 in FIG. 17 includes the sensor circuit 81, the signal processing circuit 82, and the output device 83. In the semiconductor device 80 in FIG. 17, the signal processing circuit 82 includes an analog-to-digital converter circuit (ADC) 84, an I/O interface 85, and a processor 86. The ADC 84 corresponds to the A/D converter circuit described in Embodiment 6. A combination of the sensor circuit 81 and the ADC 84 corresponds to the sensor circuit described in Embodiment 7.

The intensity of ultraviolet light applied to the sensor circuit 81 changes continuously with time, and the value of the signal Vout of the sensor circuit 81 varies accordingly. The ADC 84 has a function of obtaining the value of the signal Vout in a predetermined period and holding the value, that is, a sampling function. The ADC 84 also has a function of converting an analog value of the sampled signal Vout into a digital value.

The I/O interface 85 has a function of controlling input of a signal including the signal Vout that has been converted into digital form by the ADC 84, from the ADC 84 to the processor 86.

The processor 86 has a function of generating a signal including data on the intensity of ultraviolet light in accordance with the specifications of the output device 83, by arithmetic processing using the signal input from the ADC 84 via the I/O interface 85.

The signal processing circuit 82 may also include a circuit that processes the signal Vout. Examples of the circuit are a filter circuit and a linearization circuit.

The filter circuit has a function of removing noise from the signal Vout. The linearization circuit has a function of correcting the signal Vout so that the value of the signal Vout and the intensity of ultraviolet light have a linear relation.

Note that this embodiment can be combined with any of the matters disclosed in this specification and the like as appropriate.

Embodiment 9

This embodiment explains the off-state current of a transistor that can be used as the transistors 101, 201, 301, 481, 501, and 701.

The description is made on the results of measuring the off-state current of a transistor including a channel formation region in an oxide semiconductor film when the transistor is irradiated with light.

First, the structure of a transistor used for the measurement is described. The transistor includes a gate electrode and a gate insulating film on an insulating surface. A 100-nm-thick tungsten film is used for the gate electrode. As the gate insulating film, a 50-nm-thick silicon nitride film and a 200-nm-thick silicon oxynitride film are stacked in this order over the gate electrode. The transistor also includes a 35-nm-thick IGZO-based oxide semiconductor film that overlaps the gate electrode with the gate insulating film provided therebetween. The IGZO-based oxide semiconductor film is formed by sputtering using a target with a composition of In:Ga:Zn=1:1:1. The transistor includes, over the oxide semiconductor film, a source electrode and a drain electrode formed by stacking a 50-nm-thick tungsten film, a 400-nm-thick aluminum film, and a 100-nm-thick titanium film in this order. A 400-nm-thick silicon oxynitride film is provided over the oxide semiconductor film and the source and drain electrodes.

In the transistor used for the measurement, the channel length L is 3 µm; the channel width W is 50 µm; and the length in the channel length L direction in a region where the source and drain electrodes overlap the gate electrode is 2 µm. The measurement is performed at room temperature under a dry atmosphere in a state where the transistor is irradiated with light using a 300 W xenon light source (MAX-302 manufactured by Asahi Spectra Co., Ltd.) and the wavelength of the light is controlled with a band-pass filter. While the irradiance per unit wavelength is measured with a spectroradiometer (USR-45 manufactured by USHIO INC.), light is applied to the transistor at a constant irradiance.

Figure 18:
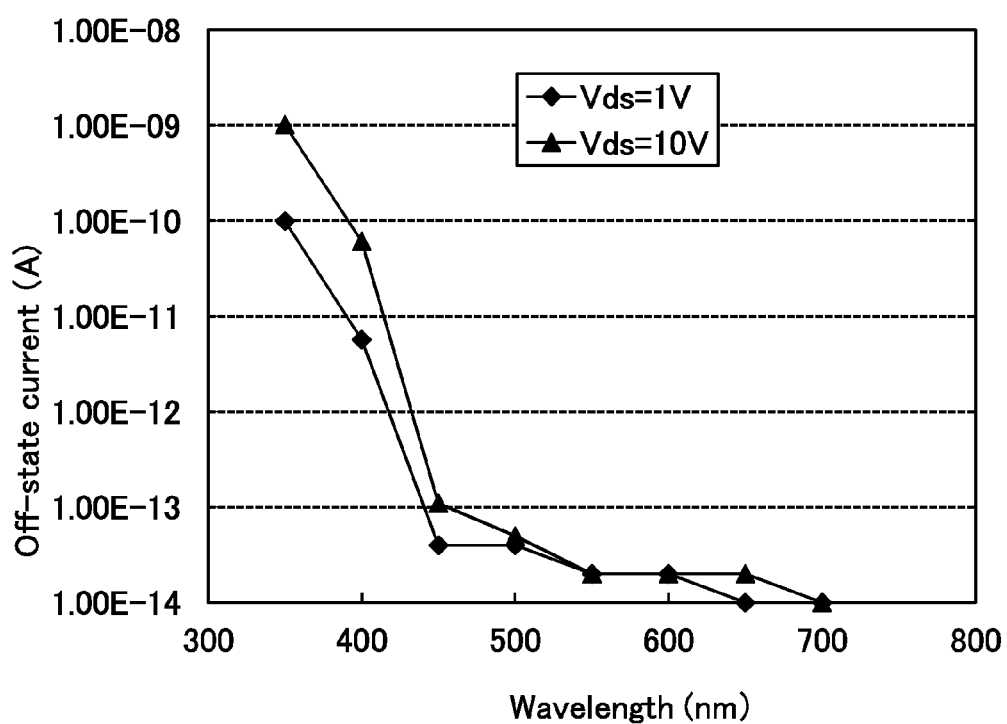
FIG. 18 is a graph showing off-state current of a transistor versus wavelength of emitted light.

FIG. 18 shows the relation between wavelength of emitted light and off-state current of the transistor that are obtained by the measurement. The measurement is performed in two cases: a case where the gate voltage is −10 V and the drain-to-source voltage Vds is 1 V; and a case where the gate voltage is −10 V and the voltage Vds is 10 V. As can be seen from FIG. 18, when visible light having a wavelength of 450 nm or larger is emitted, the off-state current of the transistor is lower than the lower measurement limit of $1\times10^{-13}$ A in both cases where the voltage Vds is 1 V and where the voltage Vds is 10 V. On the other hand, when ultraviolet light having a wavelength of 400 nm or shorter is emitted, the off-state current of the transistor is $10^2$ to $10^4$ times as high as the lower measurement limit of $1\times10^{-13}$ A in both cases where the voltage Vds is 1 V and where the voltage Vds is 10 V. That is, a transistor containing an IGZO-based oxide semiconductor has significantly higher sensitivity to ultraviolet light than sensitivity to visible light.

Next, the results of analyzing the relation between irradiance of light with a wavelength in the ultraviolet region and off-state current by measurement are shown.

The structure of a transistor used for the measurement is the same as the transistor used for the measurement shown in FIG. 18. The channel length L is 3 µm; the channel width W is $10^4$ µm; and the length in the channel length L direction in a region where the source and drain electrodes overlap the gate electrode is 2 µm. In a manner similar to the case of FIG. 18, the measurement is performed at room temperature under a dry atmosphere in a state where the transistor is irradiated with light using a 300 W xenon light source (MAX-302 manufactured by Asahi Spectra Co., Ltd.) and the wavelength of the light is controlled to be 350 nm with a band-pass filter. The irradiance of light on the transistor is controlled while measuring irradiance per unit wavelength with a spectroradiometer (USR-45 manufactured by USHIO INC.).

Figure 19:
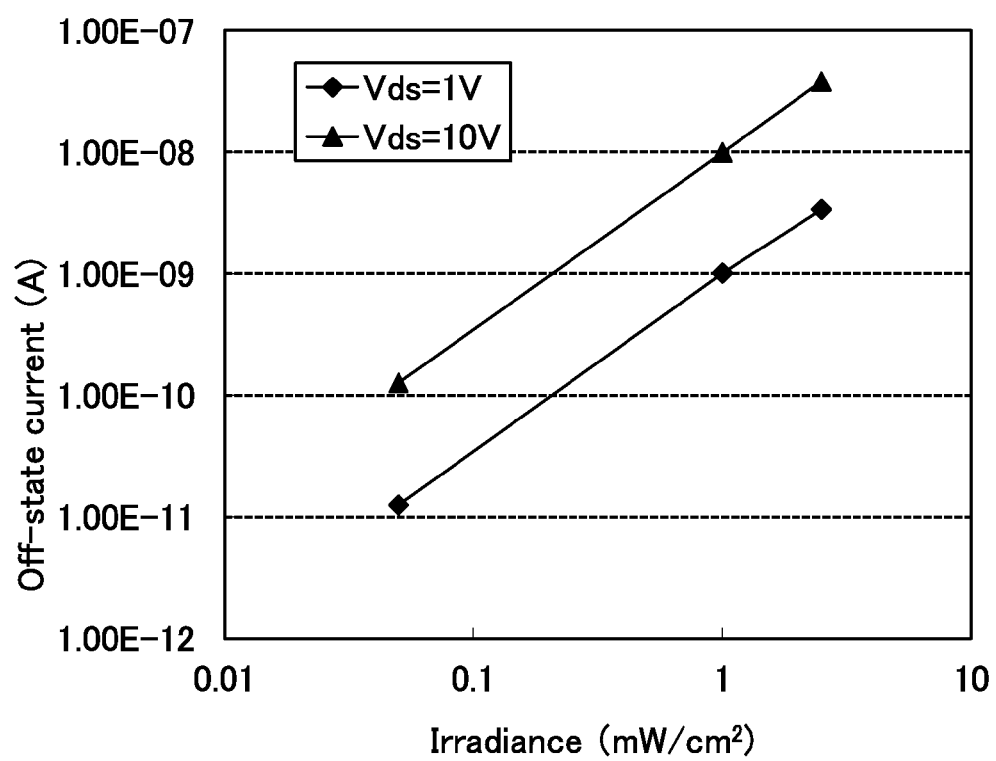
FIG. 19 is a graph showing off-state current of a transistor versus irradiance.

FIG. 19 shows the relation between irradiance (unit: $mW/cm^2$) and off-state current (unit: A) of the transistor that are obtained by the measurement. The measurement is performed in two cases: a case where the gate voltage is −10 V and the drain-to-source voltage Vds is 1 V; and a case where the gate voltage was −10 V and the voltage Vds is 10 V. As seen from FIG. 19, the off-state current of the transistor increases as the irradiance increases in both cases where the voltage Vds is 1 V and where the voltage Vds is 10 V; and a logarithm of the irradiance is substantially proportional to a logarithm of the off-state current of the transistor.

Next, the results of examining differences in electrical characteristics of transistors depending on with or without irradiation with light having a wavelength of 350 nm are shown.

First, the structure of a transistor used for the measurement is described. For the measurement, three transistors (a first transistor, a second transistor, and a third transistor) having the same structure are used. A silicon substrate is covered with a 100-nm-thick thermal oxidation film, and a 100-nm-thick silicon oxide film is formed thereover by sputtering. Each of the transistors is formed over the silicon oxide film. Each transistor includes a gate electrode formed of a 150-nm-thick tungsten film, a gate insulating film formed of a 20-nm-thick silicon oxynitride film over the gate electrode, and a 15-nm-thick IGZO-based oxide semiconductor film that overlaps the gate electrode with the gate insulating film provided therebetween. The IGZO-based oxide semiconductor film is formed by sputtering using a target with a composition of In:Ga:Zn=1:1:1. Each of the transistors includes, over the oxide semiconductor film, a source electrode and a drain electrode formed of a 100-nm-thick tungsten film. A 400-nm-thick silicon oxide film is provided over the oxide semiconductor film and the source and drain electrodes. A 1.5-µm-thick polyimide film is provided over the silicon oxide film.

Each of the transistors used for the measurement has a channel length L of 3 μm and a channel width W of 10 μm. To evaluate electrical characteristics, measurement of drain current in a dark state (Measurement 1), measurement of drain current during ultraviolet light irradiation (Measurement 2), voltage application during ultraviolet light irradiation (a stress application step), measurement of drain current during ultraviolet light irradiation (Measurement 3), and measurement of drain current in a dark state (Measurement 4) are performed in this order.

Specifically, measurement of drain current in a dark state (Measurement 1 and Measurement 4) is performed at a substrate temperature of 40° C. under a dry atmosphere in a dark room without light irradiation. For the measurement, the gate voltage Vg is changed by 0.1 V in the range of −5 V to 5 V, and the voltage Vds is 0.1 V or 3 V.

The measurement of drain current during ultraviolet light irradiation (Measurement 2 and Measurement 3) is performed at a substrate temperature of 40° C. under a dry atmosphere in a state where the transistor is irradiated with light having a wavelength of 350 nm at an irradiance of 2.5 mW/cm$^2$. For the measurement, the gate voltage Vg is changed by 0.1 V in the range of −5 V to 5 V, and the voltage Vds is 0.1 V or 3 V.

In the stress application step, a state in which the transistor is irradiated with light having a wavelength of 350 nm at an irradiance of 2.5 mW/cm$^2$ at a substrate temperature of 125° C. under a dry atmosphere is kept for one hour. In the first transistor among the three transistors, the gate voltage Vg and the voltage Vds are kept at −5 V and 5 V, respectively, through the stress application step. For the second transistor, a first state (gate voltage Vg: −5 V, voltage Vds: 5 V) and a second state (gate voltage Vg: 5 V, voltage Vds: 0 V) are alternated in the stress application step. The first state is kept for 0.1 seconds and the second state is kept for 0.9 seconds. In the third transistor, the gate voltage Vg and the voltage Vds are kept at 5 V and 0 V, respectively, through the stress application step.

Each transistor is irradiated with ultraviolet light using a 300 W xenon light source (MAX-302 manufactured by Asahi Spectra Co., Ltd.) and the wavelength of the light is controlled with a band-pass filter. While the irradiance of light having a wavelength of 350 nm is measured with a spectroradiometer (USR-45 manufactured by USHIO INC.), light is applied to the transistor so that the irradiance is kept at approximately 2.5 mW/cm$^2$.

Figure 20A:
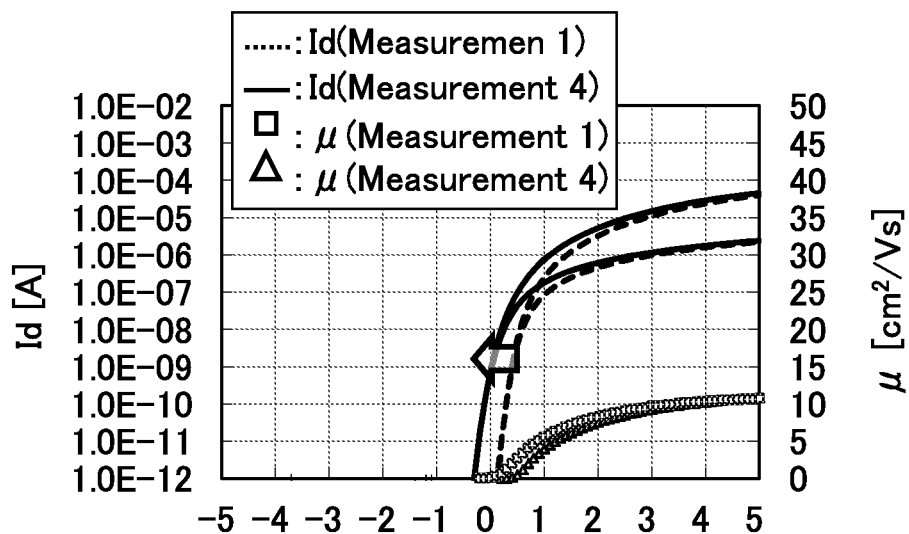
FIGS. 20A and 20B are graphs each showing drain current versus gate voltage of a transistor obtained by measurement.
Figure 20B:
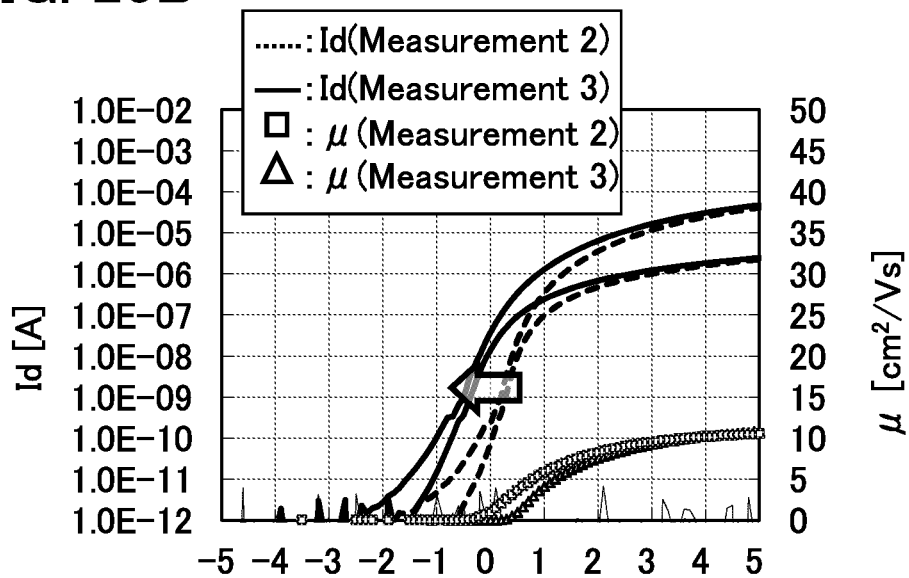

FIG. 20A shows the relation between the gate voltage Vg and the drain current Id of the first transistor that are obtained by Measurement 1 and Measurement 4. FIG. 20B shows the relation between the gate voltage Vg and the drain current Id of the first transistor that are obtained by Measurement 2 and Measurement 3. FIGS. 20A and 20B also show the mobility μ obtained by calculation. From FIG. 20A, it is found that the threshold voltage and the shift value are shifted by −0.33 V and −0.42 V, respectively, through the stress application step. From FIG. 20B, it is found the threshold voltage and the shift value are shifted by −0.45 V and −0.82 V, respectively, through the stress application step.

Note that the threshold voltage and the mobility of each transistor are calculated on the assumption that the relative dielectric constant of the gate insulating film is 4.1 and the thickness thereof is 20 nm. The shift value is defined as the value of gate voltage at the time when the drain current starts to flow. Specifically, in a graph showing the relation between gate voltage and drain current, the shift value can be defined as voltage at an intersection of a tangent where the slope of the drain current curve is the steepest and a graduation line corresponding to the lowest drain current. Here, the shift value is a value at a voltage Vds of 3 V.

Figure 21A:
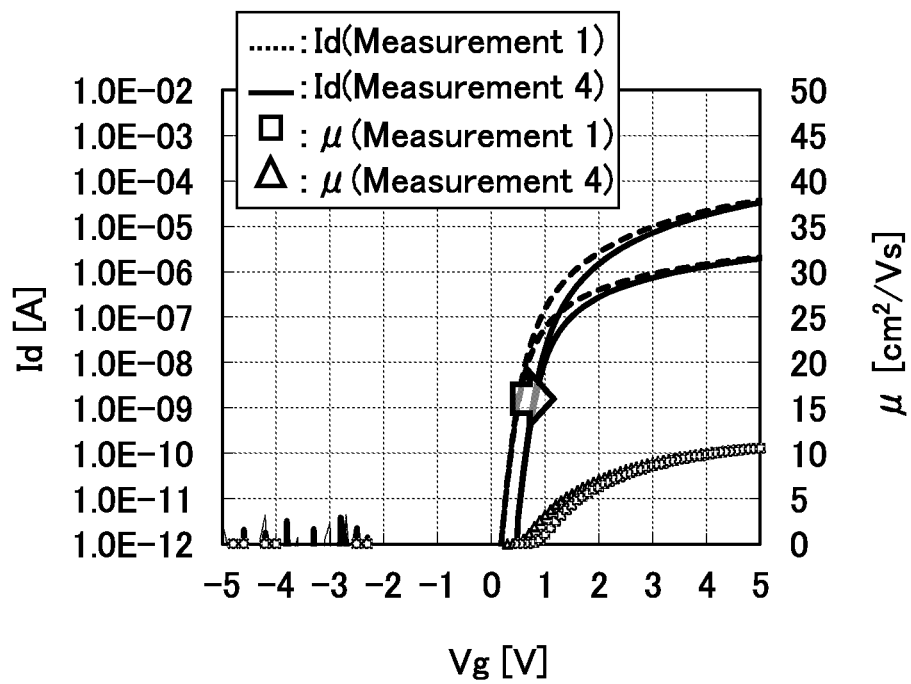
FIGS. 21A and 21B are graphs each showing drain current versus gate voltage of a transistor.
Figure 21B:
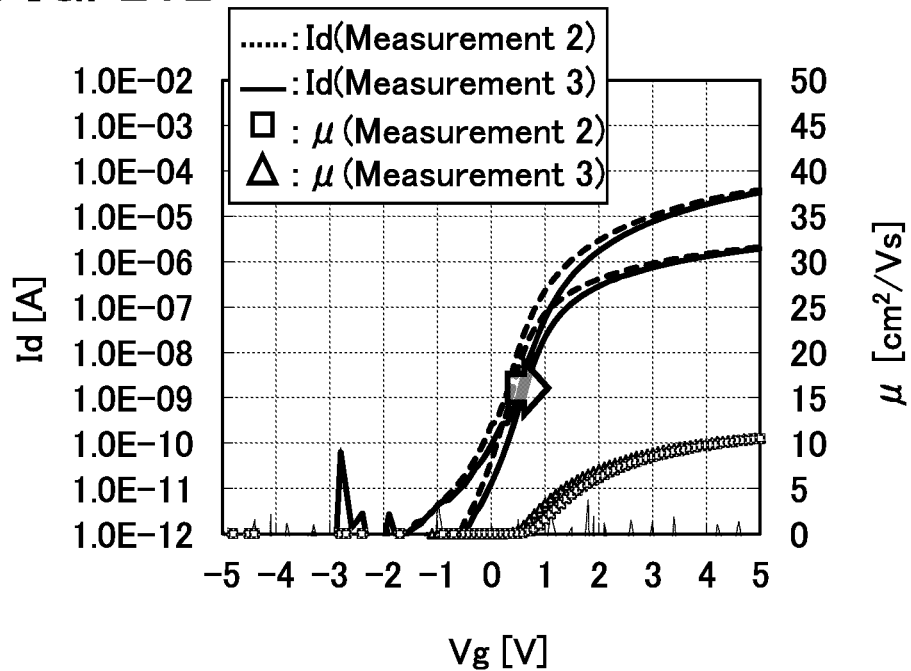

FIG. 21A shows the relation between the gate voltage Vg and the drain current Id of the second transistor that are obtained by Measurement 1 and Measurement 4. FIG. 21B shows the relation between the gate voltage Vg and the drain current Id of the second transistor that are obtained by Measurement 2 and Measurement 3. FIGS. 21A and 21B also show the mobility μ obtained by calculation. From FIG. 21A, it is found that the threshold voltage and the shift value are shifted by +0.28 V and +0.26 V, respectively, through the stress application step. From FIG. 21B, it is found that the threshold voltage and the shift value are shifted by +0.28 V and +0.17 V, respectively, through the stress application step.

Figure 22A:
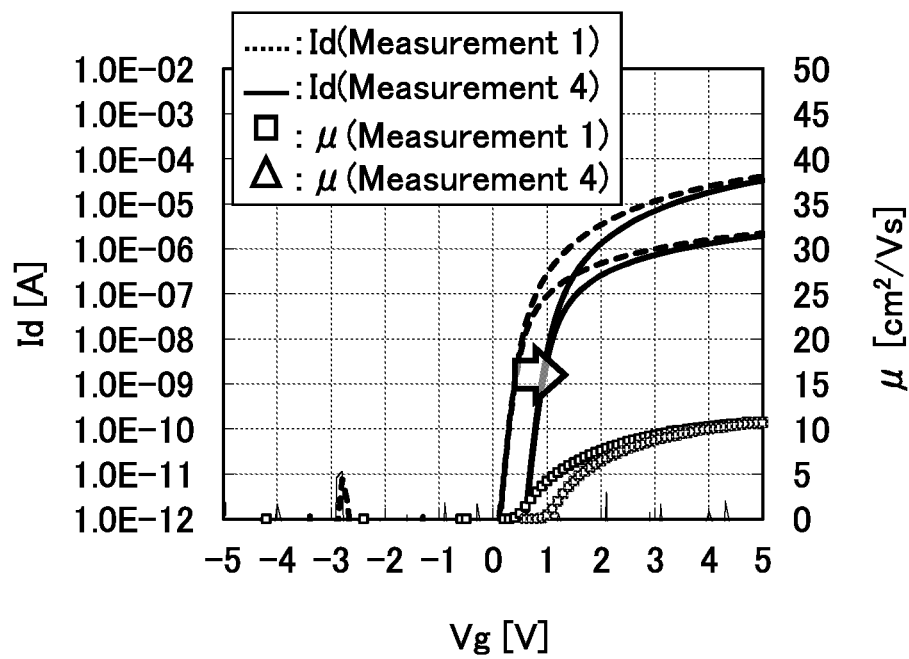
FIGS. 22A and 22B are graphs each showing drain current versus gate voltage of a transistor.
Figure 22B:
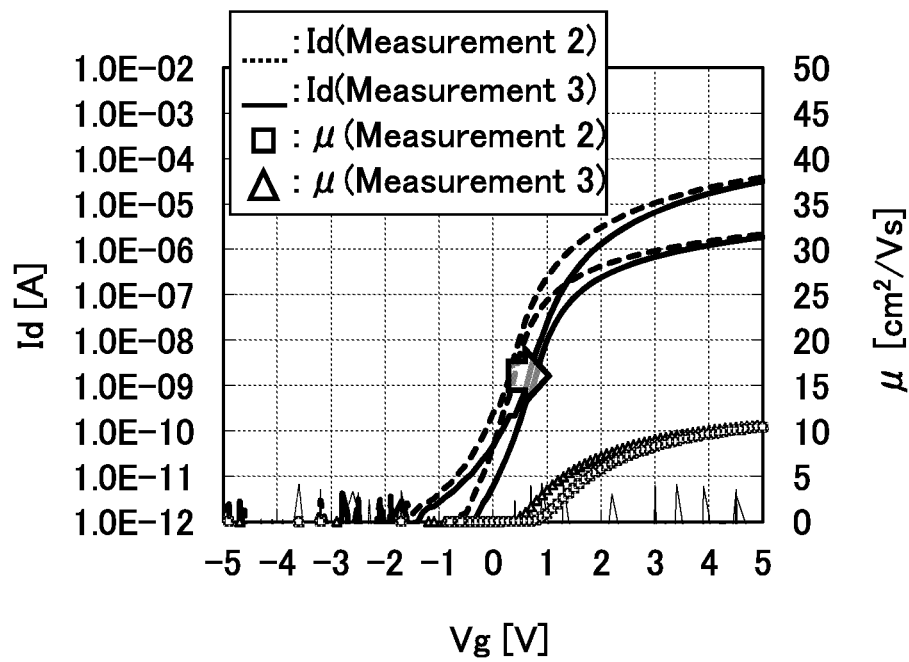

FIG. 22A shows the relation between the gate voltage Vg and the drain current Id of the third transistor that are obtained by Measurement 1 and Measurement 4. FIG. 22B shows the relation between the gate voltage Vg and the drain current Id of the third transistor that are obtained by Measurement 2 and Measurement 3. FIGS. 22A and 22B also show the mobility μ obtained by calculation. From FIG. 22A, it is found that the threshold voltage and the shift value are shifted by +0.42 V and +0.44 V, respectively, through the stress application step. From FIG. 22B, it is found that the threshold voltage and the shift value are shifted by +0.44 V and +0.30 V, respectively, through the stress application step.

FIGS. 20A and 20B, FIGS. 21A and 21B, and FIGS. 22A and 22B reveal the following. First, a change of the shift value in the drain current measurement during ultraviolet light irradiation (Measurements 2 and 3) is smaller than that in the drain current measurement in a dark state (Measurements 1 and 4). Second, the threshold voltage and the shift value of the first transistor are shifted in the negative direction by the stress application step, whereas the threshold voltage and the shift value of the third transistor are shifted in the positive direction by the stress application step. Third, the changes in threshold voltage and shift value of the second transistor are smaller than those of the first transistor and the third transistor. Thus, by the driving method in which a first state (the potential of the gate is lower than the potential of the source or the drain) and a second state (the potential of the gate is higher than the potential of the source or the drain) are alternated, the change in electrical characteristics (e.g., the threshold voltage and shift value) can be small, compared with the driving method in which the first state is kept and the driving method in which the second state is kept. The driving method in which the first state and the second state are alternately repeated is highly effective in preventing the change in electrical characteristics particularly when the percentage of the first state in the total period is set higher than 0% and lower than or equal to 10%.

Note that this embodiment can be combined with any of the matters disclosed in this specification and the like as appropriate.

Embodiment 10

In this embodiment, an example of a cross-sectional structure of a sensor circuit will be described.

Figure 23:
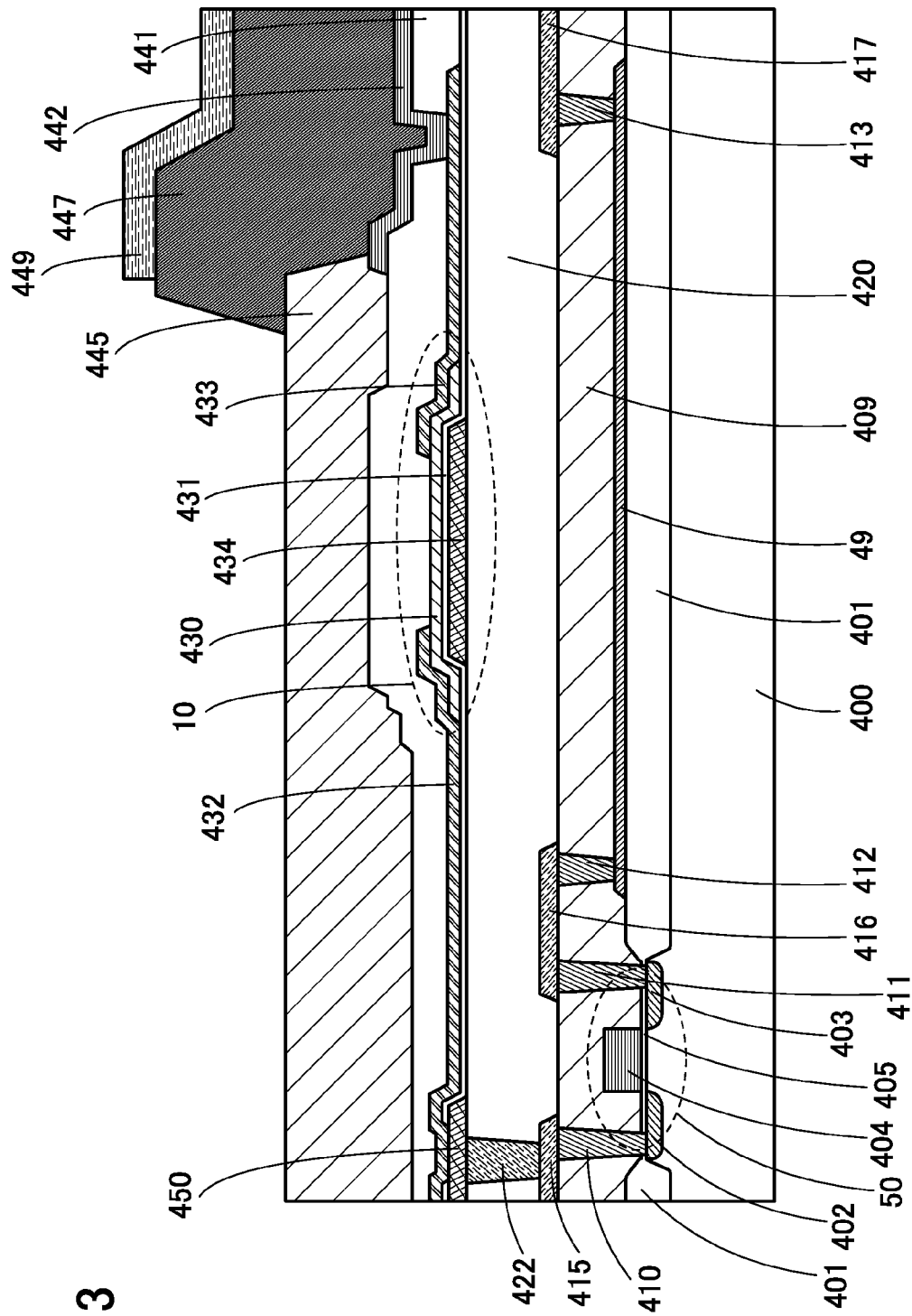
FIG. 23 illustrates a sensor circuit.

FIG. 23 illustrates an example of a cross-sectional structure of the sensor circuit of one embodiment of the present invention. A transistor 10 is formed over a transistor 50. Specifically, the transistor 10 is formed over an insulating film 409 or an insulating film 420 over the transistor 50. The transistor 10 includes a channel formation region in an oxide semiconductor film. The transistor 50 includes a channel formation region in a single crystal silicon substrate.

The transistor 10 corresponds to the transistor 101, the transistor 201, the transistor 301, the transistor 481, the transistor 501, or the transistor 701.

The transistor 50 corresponds to the transistor included in the operational amplifier 102, the transistor 206, the switch 202, the switch 203, the switch 204, the transistor included in the circuit 300, the transistor 303, the transistor 304, the transistor 305, the transistor 306, the switch 483, the transistor included in the circuit 480, the transistor included in the circuit 500, or the switch 503. An active layer in the transistor 50 can be an amorphous, microcrystalline, polycrystalline, or single crystal semiconductor film of silicon, germanium, or the like. Alternatively, the channel formation region of the transistor 50 may be formed in an oxide semiconductor film. When the transistor 50 is formed using a silicon thin film, its active layer can be a semiconductor film containing any of the following, for example: amorphous silicon formed by sputtering or vapor deposition such as plasma-enhanced CVD, polycrystalline silicon obtained by crystallization of amorphous silicon by laser annealing or the like, and single crystal silicon obtained in such a manner that a surface portion of a single crystal silicon wafer is separated after implantation of hydrogen ions or the like into the silicon wafer.

Examples of a semiconductor substrate 400 on which the transistor 50 is formed are an n-type or p-type silicon substrate, germanium substrate, silicon germanium substrate, and compound semiconductor substrate (e.g., GaAs substrate, InP substrate, GaN substrate, SiC substrate, GaP substrate, GaInAsP substrate, and ZnSe substrate). In FIG. 23, a single crystal silicon substrate having n-type conductivity is used as an example.

The transistor 50 is electrically isolated from other transistors by an element isolation insulating film 401. The element isolation insulating film 401 can be formed by a selective oxidation method (local oxidation of silicon (LOCOS) method), a trench isolation method, or the like.

In the case where a p-channel transistor is formed on the semiconductor substrate 400, an impurity element imparting p-type conductivity is selectively introduced to a region where the p-channel transistor is formed, so that a region called an n-well is formed.

Specifically, the transistor 50 includes impurity regions 402 and 403 that are formed in the semiconductor substrate 400 and function as a source region and a drain region, a gate electrode 404, and a gate insulating film 405 provided between the semiconductor substrate 400 and the gate electrode 404. The gate electrode 404 overlaps a channel formation region formed between the impurity regions 402 and 403, with the gate insulating film 405 placed between the gate electrode 404 and the channel formation region.

A resistor 49 is provided over the element isolation insulating film 401. A semiconductor film containing polycrystalline, microcrystalline, or amorphous silicon can be used for the resistor 49, for example.

The insulating film 409 is provided over the transistor 50. Openings are formed in the insulating film 409. Wirings 410 and 411 that are in contact with the impurity regions 402 and 403, respectively, and wirings 412 and 413 that are in contact with the resistor 49 are formed in the openings.

The wiring 410 is connected to a wiring 415 formed over the insulating film 409. The wirings 411 and 412 are connected to a wiring 416 formed over the insulating film 409. The wiring 413 is connected to a wiring 417 formed over the insulating film 409.

The insulating film 420 is formed over the wirings 415 to 417. An opening is formed in the insulating film 420. A wiring 422 electrically connected to the wiring 415 is formed in the opening.

In FIG. 23, the transistor 10 and a conductive film 450 electrically connected to the wiring 422 are formed over the insulating film 420.

The transistor 10 includes, over the insulating film 420, a gate electrode 434, a gate insulating film 431 over the gate electrode 434, a semiconductor film 430 that contains an oxide semiconductor and overlaps the gate electrode 434 with the gate insulating film 431 provided therebetween, and conductive films 432 and 433 that are provided over the semiconductor film 430 and serve as a source electrode and a drain electrode. The conductive film 432 is electrically connected to the conductive film 450 via an opening formed in the gate insulating film 431.

An insulating film 441 is provided over the transistor 10. An opening is provided in the insulating film 441. A conductive film 442 is provided over the insulating film 441 to be in contact with the conductive film 433 via the opening.

An insulating film 445 is provided over the insulating film 441 and the conductive film 442. An opening is provided in the insulating film 445. A conductive film 447 that is in contact with the conductive film 442 through the opening is provided over the insulating film 445. The conductive film 447 preferably has high surface flatness because it is connected to a bias circuit or the like later. For this reason, a resin in which conductive particles are dispersed is suitable for the material of the conductive film 447. Since the resin has low adhesion to a solder, a conductive film 449 is formed over the conductive film 447 by using a conductive material having high adhesion to a solder to be in contact with the conductive film 447.

In FIG. 23, the transistor 10 includes the gate electrode 434 on at least one side of the semiconductor film 430. Alternatively, the transistor 10 may include a pair of gate electrodes with the semiconductor film 430 placed therebetween.

When the transistor 10 includes a pair of gate electrodes with the semiconductor film 430 positioned therebetween, a signal for controlling the on/off state may be supplied to one of the gate electrodes, and the other of the gate electrodes may be supplied with a potential from another element. In this case, potentials with the same level may be supplied to the pair of gate electrodes, or a fixed potential such as a ground potential may be supplied only to the other of the gate electrodes. By controlling the level of a potential supplied to the other of the gate electrodes, the threshold voltage of the transistor can be controlled.

In FIG. 23, the transistor 10 has a single-gate structure in which one channel formation region corresponding to one gate electrode 434 is provided. Alternatively, the transistor 10 may have a multi-gate structure where a plurality of channel formation regions are formed in one active layer by providing a plurality of gate electrodes electrically connected to each other.

<Semiconductor Film>

Note that a highly purified oxide semiconductor (purified OS) obtained by reduction of impurities that serve as electron donors (donors), such as moisture or hydrogen, and by reduction of oxygen vacancies is an intrinsic (i-type) semiconductor or a substantially i-type semiconductor. For this reason, a transistor having a channel formation region in a highly purified oxide semiconductor film exhibits extremely low off-state current and has high reliability.

When an oxide semiconductor film is used as the semiconductor film, at least indium (In) or zinc (Zn) is preferably included as an oxide semiconductor. In addition, as a stabilizer for reducing variation in electric characteristics among transistors formed using such an oxide semiconductor, gallium (Ga) is preferably contained in addition to In and Zn. Furthermore, tin (Sn), hafnium (Hf), aluminum (Al), and/or zirconium (Zr) is/are preferably contained as a stabilizer.

In—Ga—Zn-based oxide and In—Sn—Zn-based oxide among oxide semiconductors have the following advantages over silicon carbide, gallium nitride, and gallium oxide: transistors with excellent electrical characteristics can be formed by sputtering or a wet process and thus can be mass-produced easily. Moreover, unlike in the case of using silicon carbide, gallium nitride, or gallium oxide, with the use of the In—Ga—Zn-based oxide, transistors with excellent electrical characteristics can be formed over a glass substrate, and a larger substrate can be used.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, any of the following oxides can be used, for example: indium oxide, gallium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

For example, an In—Ga—Zn-based oxide refers to an oxide containing In, Ga, and Zn and there is no particular limitation on the ratio of In, Ga, and Zn. Furthermore, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Moreover, the In—Ga—Zn-based oxide has high mobility.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to any of the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), In:Sn:Zn=2:1:5 (=1/4:1/8:5/8), or an oxide with an atomic ratio close to any of the above atomic ratios can be used.

For example, high mobility can be obtained relatively easily with an In—Sn—Zn-based oxide. Meanwhile, when an In—Ga—Zn-based oxide is used, the mobility can be increased by reduction in the defect density in a bulk.

A structure of the oxide semiconductor film is described below.

In this specification, the term "parallel" indicates that the angle formed between two straight lines ranges from −10° to 10°, and accordingly also includes the case where the angle ranges from −5° to 5°. The term "substantially parallel" indicates that an angle formed between two straight lines ranges from −30° to 30°. The term "perpendicular" indicates that the angle formed between two straight lines ranges from 80° to 100°, and accordingly also includes the case where the angle ranges from 85° to 95°. The term "substantially perpendicular" indicates that an angle formed between two straight lines ranges from 60° to 120°. In this specification, trigonal and rhombohedral crystal systems are included in a hexagonal crystal system.

An oxide semiconductor film is classified roughly into a single crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is an oxide semiconductor films having a plurality of c-axis aligned crystal parts.

With a transmission electron microscope (TEM), a combined analysis image (high-resolution TEM image) of a bright-field image and a diffraction pattern of the CAAC-OS film is observed, and a plurality of crystal part can be clearly observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer reflects unevenness of a surface over which the CAAC-OS film is formed (hereinafter a surface over which the CAAC-OS film is formed is referred to as a formation surface) or a top surface of the CAAC-OS film, and is arranged parallel to the formation surface or the top surface of the CAAC-OS film.

In the high-resolution planar TEM image of the CAAC-OS film observed in a direction substantially perpendicular to the sample surface, metal atoms arranged in a triangular or hexagonal configuration are seen in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently at a diffraction angle ($2\theta$ of around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

When the CAAC-OS film with an $InGaZnO_4$ crystal is analyzed by an out-of-plane method, a peak may also be observed at $2\theta$ of around 36° as well as at $2\theta$ of around 31°. The peak at $2\theta$ of around 36° indicates that a crystal having no c-axis alignment is included in part of the CAAC-OS film. It is preferable that in the CAAC-OS film, a peak appear at $2\theta$ of around 31° and a peak not appear at $2\theta$ of around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. A heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (rarely has normally-on characteristics). The highly purified intrinsic or substantially highly purified intrinsic oxide semiconductor film has a low density of defect states, and thus has few carrier traps. Consequently, the transistor including the oxide semiconductor film has little variation in electrical characteristics and high reliability. Electric charge trapped by the carrier traps in the oxide semiconductor film takes a long time to be released and might behave like fixed electric charge. Thus, the transistor including the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

In a high-resolution TEM image of a microcrystalline oxide semiconductor film, there are a region where a crystal part is observed and a region where a crystal part is not clearly observed. In most cases, a crystal part in the microcrystalline oxide semiconductor ranges from 1 nm to 100 nm, or from 1 nm to 10 nm. A microcrystal with a size ranging from 1 nm to 10 nm or from 1 nm to 3 nm is specifically referred to as nanocrystal (nc). An oxide semiconductor film including nanocrystal is referred to as a nanocrystalline oxide semiconductor (nc-OS) film. In a high-resolution TEM image of the nc-OS film, a grain boundary cannot be found clearly in some cases.

In the nc-OS film, a microscopic region (e.g., a region with a size ranging from 1 nm to 10 nm, in particular, from 1 nm to 3 nm) has a periodic atomic order. Note that there is no regularity of crystal orientation between different crystal parts in the nc-OS film. Thus, the orientation of the whole film is not observed. Consequently, in some cases, the nc-OS film cannot be distinguished from an amorphous oxide semiconductor film depending on an analysis method.

For example, when the nc-OS film is subjected to structural analysis by an out-of-plane method with an XRD apparatus using an X-ray having a diameter larger than that of a crystal part, a peak showing a crystal plane does not appear. A diffraction pattern like a halo pattern appears in a selected-area electron diffraction pattern of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to or smaller than the diameter of a crystal part. Furthermore, in a nanobeam electron diffraction pattern of the nc-OS film, regions with high luminance in a circular (ring) pattern are sometimes shown. Also in a nanobeam electron diffraction pattern of the nc-OS film, a plurality of spots are sometimes shown in a ring-like region.

The nc-OS film is an oxide semiconductor film that has higher regularity than an amorphous oxide semiconductor film, and therefore has a lower density of defect states than an amorphous oxide semiconductor film. However, there is no regularity of crystal orientation between different crystal parts in the nc-OS film; hence, the nc-OS film has a higher density of defect states than the CAAC-OS film.

Next, an amorphous oxide semiconductor film is described.

The amorphous oxide semiconductor film has disordered atomic arrangement and no crystal part. An example of the amorphous oxide semiconductor film is an oxide semiconductor film with a non-crystalline state like quartz glass.

In the high-resolution TEM image of the amorphous oxide semiconductor film, crystal parts cannot be found.

When the amorphous oxide semiconductor film is subjected to structural analysis by an out-of-plane method with an XRD apparatus, a peak showing a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization occurs by a slight amount of electron beam used for TEM observation and growth of the crystal part is found in some cases. In contrast, crystallization due to a slight amount of electron beam used for TEM observation is hardly observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Thus, the spacing between these adjacent layers is substantially equivalent to the lattice spacing (also referred to as d value) on the (009) plane, and is 0.29 nm according to crystal structure analysis. Consequently, each of the lattice fringes in which the spacing therebetween is from 0.28 nm to 0.30 nm corresponds to the a-b plane of the InGaZnO$_4$ crystal, focusing on the lattice fringes in the high-resolution TEM image.

The density of an oxide semiconductor film might vary depending on its structure. For example, if the composition of an oxide semiconductor film is determined, the structure of the oxide semiconductor film can be estimated from a comparison between the density of the oxide semiconductor film and the density of a single crystal oxide semiconductor film having the same composition as the oxide semiconductor film. For example, the density of an a-like OS film is 78.6% or higher and lower than 92.3% of the density of the single crystal oxide semiconductor film. In addition, for example, the density of an nc-OS film or a CAAC-OS film is 92.3% or higher and lower than 100% of the density of the single crystal oxide semiconductor film. Note that it is difficult to deposit an oxide semiconductor film whose density is lower than 78% of the density of the single crystal oxide semiconductor film.

A specific example of the above is described. For example, in an oxide semiconductor film with an atomic ratio of In:Ga:Zn=1:1:1, the density of single crystal InGaZnO$_4$ with a rhombohedral crystal structure is 6.357 g/cm$^3$. Thus, for example, the density of an a-like OS film with an atomic ratio of In:Ga:Zn=1:1:1 is higher than or equal to 5.0 g/cm$^3$ and lower than 5.9 g/cm$^3$. Moreover, for example, the density of an nc-OS film or a CAAC-OS film with an atomic ratio of In:Ga:Zn=1:1:1 is higher than or equal to 5.9 g/cm$^3$ and lower than 6.3 g/cm$^3$.

Note that single crystals with the same composition do not exist in some cases. In such a case, by combining single crystals with different compositions at a given proportion, it is possible to calculate a density that corresponds to the density of a single crystal with a desired composition. The density of the single crystal with a desired composition may be calculated using weighted average with respect to the combination ratio of the single crystals with different compositions. Note that it is preferable to combine as few kinds of single crystals as possible for density calculation.

Note that an oxide semiconductor film may be a stacked film including two or more films of an amorphous oxide semiconductor film, an a-like OS film, a microcrystalline oxide semiconductor film, and a CAAC-OS film, for example.

For example, the CAAC-OS film is formed by sputtering with a polycrystalline metal oxide target. By collision of ions with the target, a crystal region included in the target may be separated from the target along an a-b plane; in other words, a sputtered particle having a plane parallel to the a-b plane (flat-plate-like sputtered particle or pellet-like sputtered particle) may flake off from the target. In that case, the flat-plate-like or pellet-like sputtered particle reaches a substrate in the state of maintaining its crystal state, whereby the CAAC-OS film can be formed.

For the deposition of the CAAC-OS film, the following conditions are preferably used.

Decay of the crystal state due to impurities can be prevented by reducing the amount of impurities entering the CAAC-OS film during the deposition, for example, by reducing the concentration of impurities (e.g., hydrogen, water, carbon dioxide, and nitrogen) that exist in a treatment chamber or by reducing the concentration of impurities in a deposition gas. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition ranges from 100° C. to 740° C., preferably from 200° C. to 500° C. When the substrate heating temperature during the deposition is increased and flat-plate-like or pellet-like sputtered particles reach the substrate, migration occurs on the substrate, and a flat plane of each sputtered particle is attached to the substrate.

It is preferable that the proportion of oxygen in the deposition gas be increased and the power be optimized in order to reduce plasma damage in the deposition. The proportion of oxygen in the deposition gas is 30 vol % or higher, preferably 100 vol %.

As an example of the target, an In—Ga—Zn-based oxide target is described below.

A polycrystalline In—Ga—Zn-based oxide target is made by mixing InO$_X$ powder, GaO$_Y$ powder, and ZnO$_Z$ powder in a predetermined molar ratio, applying pressure, and performing heat treatment at a temperature of 1000° C. to 1500° C. Note that X, Y, and Z are each a given positive number. Here, the predetermined molar ratio of InO$_X$ powder to GaO$_Y$ powder and ZnO$_Z$ powder is, for example, 2:2:1, 8:4:3, 3:1:1, 1:4:4, 1:1:1, 4:2:3, or 3:1:2. The kinds of powder and the molar ratio for mixing powder can be determined as appropriate depending on the desired target.

Alkali metal is not a constituent element of an oxide semiconductor and thus is an impurity. Likewise, alkaline earth metal is an impurity when the alkaline earth metal is not a constituent element of the oxide semiconductor. When an insulating film in contact with an oxide semiconductor film is an oxide, Na, among the alkali metals, diffuses into the insulating film and becomes Na$^+$. Furthermore, in the oxide semiconductor film, Na cuts or enters a bond between metal and oxygen that are constituent elements of the oxide semiconductor. As a result, the electrical characteristics of the transistor deteriorate, for example, the transistor is placed in a normally-on state because of a negative shift of the threshold voltage or the mobility is decreased. In addition, the characteristics of transistors vary. Specifically, the Na concentration measured by secondary ion mass spectrometry is preferably 5×10$^{16}$/cm$^3$ or lower, more preferably 1×10$^{16}$/cm$^3$ or lower, still more preferably 1×10$^{15}$/cm$^3$ or lower. Similarly, the measured Li concentration is preferably 5×10$^{15}$/cm$^3$ or lower, more preferably 1×10$^{15}$/cm$^3$ or lower. Similarly, the measured K concentration is preferably 5×10$^{15}$/cm$^3$ or lower, more preferably 1×10$^{15}$/cm$^3$ or lower.

In the case where metal oxide containing indium is used, silicon or carbon having higher bond energy with oxygen than indium might cut the bond between indium and oxygen, and an oxygen vacancy may be formed. Accordingly, like alkali metal or alkaline earth metal, silicon or carbon contained in the oxide semiconductor film is likely to cause deterioration of the electric characteristics of the transistor. Thus, the concentrations of silicon and carbon in the oxide semiconductor film are preferably low. Specifically, the C concentration or the Si concentration measured by secondary ion mass spectrometry is preferably less than or equal to 1×10$^{18}$/cm$^3$. In this case, the deterioration of the electric characteristics of the transistor can be prevented, so that the reliability of a sensor circuit or a semiconductor device can be improved.

A metal in the source and drain electrodes might extract oxygen from the oxide semiconductor film depending on a conductive material used for the source and drain electrodes. In such a case, regions of the oxide semiconductor film in contact with the source and drain electrodes become n-type regions because of the formation of an oxygen vacancy.

The n-type region serves as a source region or a drain region, resulting in a decrease in the contact resistance between the oxide semiconductor film and the source electrode or the drain electrode. Accordingly, the formation of the n-type regions increases the mobility and on-state current of the transistor, which achieves high-speed operation of a switch circuit using the transistor.

Note that the extraction of oxygen by a metal in the source and drain electrodes is probably caused when the source and drain electrodes are formed by sputtering or when heat treatment is performed after the formation of the source and drain electrodes.

The n-type regions are more likely to be formed when the source and drain electrodes are formed using a conductive material that is easily bonded to oxygen. Examples of such a conductive material include Al, Cr, Cu, Ta, Ti, Mo, and W.

The oxide semiconductor film is not limited to a single-layer metal oxide film and may have a stacked structure of a plurality of metal oxide films. In a semiconductor film in which first to third metal oxide films are sequentially stacked, for example, the first metal oxide film and the third metal oxide film are each an oxide film that contains at least one of the metal elements contained in the second metal oxide film and whose lowest conduction band energy is closer to the vacuum level than that of the second metal oxide film by higher than or equal to 0.05 eV, 0.07 eV, 0.1 eV, or 0.15 eV and lower than or equal to 2 eV, 1 eV, 0.5 eV, or 0.4 eV. The second metal oxide film preferably contains at least indium in order to increase the carrier mobility.

In the transistor including the above oxide semiconductor film, when a voltage is applied to the gate electrode so that an electric field is applied to the semiconductor film, a channel region is formed in the second metal oxide film with the lowest conduction band energy in the semiconductor film. That is, since the third metal oxide film is provided between the second metal oxide film and the gate insulating film, a channel region can be formed in the second metal oxide film, which is insulated from the gate insulating film.

Since the third metal oxide film contains at least one of the metal elements contained in the second metal oxide film, interface scattering is unlikely to occur at the interface between the second metal oxide film and the third metal oxide film. Thus, the movement of carriers is unlikely to be inhibited at the interface, resulting in an increase in the field-effect mobility of the transistor.

If an interface level is formed at the interface between the second metal oxide film and the first metal oxide film, a channel region is formed also in the vicinity of the interface, which causes a change in the threshold voltage of the transistor. However, since the first metal oxide film contains at least one of the metal elements contained in the second metal oxide film, an interface level is unlikely to be formed at the interface between the second metal oxide film and the first metal oxide film. Accordingly, the above structure can reduce variations in the electrical characteristics of transistors, such as the threshold voltage.

A plurality of metal oxide films are preferably stacked so that an interface level that inhibits carrier flow is not formed at the interface between the metal oxide films due to an impurity existing between the metal oxide films. This is because if an impurity exists between the stacked metal oxide films, the continuity of the lowest conduction band energy between the metal oxide films is lost, and carriers are trapped or disappear by recombination in the vicinity of the interface. By reducing an impurity existing between the films, a continuous junction (here, particularly a U-shape well structure whose lowest conduction band energy is changed continuously between the films) is formed more easily than the case of merely stacking a plurality of metal oxide films that contain at least one common metal as a main component.

In order to form such a continuous energy band, the films need to be stacked successively without being exposed to the air by using a multi-chamber deposition system (sputtering system) provided with a load lock chamber. Each chamber of the sputtering apparatus is preferably evacuated to a high vacuum (to about $5\times10^{-7}$ Pa to $1\times10^{-4}$ Pa) by an adsorption vacuum pump such as a cryopump so that water and the like acting as impurities for the oxide semiconductor are removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the sputtering gas is highly purified to have a dew point of $-40°$ C. or lower, preferably $-80°$ C. or lower, more preferably $-100°$ C. or lower, moisture and the like can be prevented from entering the oxide semiconductor film as much as possible.

For example, the first metal oxide film and/or the third metal oxide film is an oxide film containing aluminum, silicon, titanium, gallium, germanium, yttrium, zirconium, tin, lanthanum, cerium, or hafnium at a higher atomic ratio than the second metal oxide film. Specifically, the first metal oxide film and/or the third metal oxide film is preferably an oxide film with a content of any of the above elements 1.5 times or more, preferably 2 times or more, further preferably 3 times or more that of the second metal oxide film in an atomic ratio. The above element is strongly bonded to oxygen and thus has a function of suppressing generation of oxygen vacancies in the oxide film. Accordingly, the first metal oxide film and/or the third metal oxide film can be an oxide layer in which oxygen vacancies are less likely to be generated than in the second metal oxide film.

Specifically, when both the second metal oxide film and the first or third metal oxide film are In-M-Zn-based oxide films and the atomic ratio of the first or third metal oxide film is In:M:Zn=$x_1$:$y_1$:$z_1$ and that of the second metal oxide film is In:M:Zn=$x_2$:$y_2$:$z_2$, the atomic ratios are set so that $y_1/x_1$ is larger than $y_2/x_2$. Note that the element M is a metal element whose bonding strength to oxygen is larger than that of In, and can be Al, Ti, Ga, Y, Zr, Sn, La, Ce, Nd, or Hf, for example. The atomic ratios are preferably set so that $y_1/x_1$ is 1.5 times or more, preferably 2 times or more, further preferably 3 times or more $y_2/x_2$. Here, in the second metal oxide film, $y_2$ is preferably larger than or equal to $x_2$ because the transistor can have stable electrical characteristics. Note that the field-effect mobility of the transistor is reduced when $y_2$ is 3 times or more $x_2$; consequently, $y_2$ is preferably smaller than 3 times $x_2$.

The first and third metal oxide films each have a thickness of 3 nm to 100 nm, preferably 3 nm to 50 nm. The second metal oxide film has a thickness of 3 nm to 200 nm, preferably 3 nm to 100 nm, further preferably 3 nm to 50 nm.

In the three-layer semiconductor film, each of the first to third metal oxide films can be amorphous or crystalline. Note that the second metal oxide film in which a channel region is formed is preferably crystalline, in which case the transistor can have stable electrical characteristics.

Note that a channel formation region refers to a region of a semiconductor film of a transistor that overlaps with a gate electrode and is located between a source electrode and a drain electrode. A channel region refers to a region through which current mainly flows in the channel formation region.

For example, when an In—Ga—Zn-based oxide film formed by sputtering is used as each of the first and third metal oxide films, the first and third metal oxide films can be deposited with use of an In—Ga—Zn-based oxide target containing In, Ga, and Zn at an atomic ratio of 1:3:2. The deposition conditions can be as follows, for example: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

When the second metal oxide film is a CAAC-OS film, the second metal oxide film is preferably deposited with use of a polycrystalline In—Ga—Zn-based oxide target containing In, Ga, and Zn at an atomic ratio of 1:1:1. The deposition conditions can be as follows, for example: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

Note that an end portion of the semiconductor film included in the transistor may be inclined or may be rounded.

Also in the case where a semiconductor film including stacked metal oxide films is used in the transistor, a region in contact with the source electrode or the drain electrode may be an n-type region. Such a structure increases the mobility and on-state current of the transistor and achieves high-speed operation of a sensor circuit or a semiconductor device using the transistor. Moreover, when the semiconductor film including the stacked metal oxide films is used in the transistor, the n-type region particularly preferably reaches the second metal oxide film part of which is to be a channel region, because the mobility and on-state current of the transistor are increased and higher-speed operation of a sensor circuit or a semiconductor device is achieved.

Figure 24:
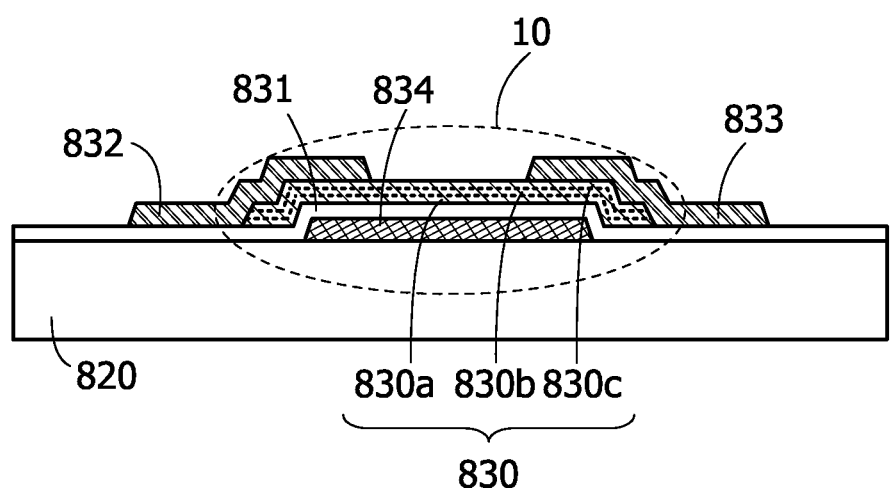
FIG. 24 illustrates a transistor.

FIG. 24 illustrates another example of the cross-sectional structure of the transistor 10. The transistor 10 illustrated in FIG. 24 includes a gate electrode 834 over an insulating film 820 and the like, a gate insulating film 831 over the gate electrode 834, a semiconductor film 830 that overlaps the gate electrode 834 with the gate insulating film 831 provided therebetween, and conductive films 832 and 833 electrically connected to the semiconductor film 830.

The semiconductor film 830 is not necessarily a single oxide semiconductor film, but may be a stack of oxide semiconductor films. FIG. 24 illustrates an example in which the semiconductor film 830 is formed using a stack of three oxide semiconductor films. Specifically, in the transistor 10 in FIG. 24, oxide semiconductor films 830a to 830c are stacked sequentially from the insulating film 820 side as the semiconductor film 830.

Each of the oxide semiconductor films 830a and 830c is an oxide film that contains at least one of metal elements contained in the oxide semiconductor film 830b. The energy at the bottom of the conduction band of the oxide semiconductor films 830a and 830c is closer to the vacuum level than that of the oxide semiconductor film 830b by higher than or equal to 0.05 eV, 0.07 eV, 0.1 eV, or 0.15 eV and lower than or equal to 2 eV, 1 eV, 0.5 eV, or 0.4 eV. The oxide semiconductor film 830b preferably contains at least indium because carrier mobility is increased.

It is possible that radiation such as X-rays is converted into ultraviolet light by a scintillator and the ultraviolet light is emitted to the transistor 10. In this manner, data based on the intensity of radiation such as X-rays is obtained. An example of the scintillator is a plastic scintillator. An example of the base of a plastic scintillator is polystyrene. Examples of an additive for a plastic scintillator are polyphenylene oxide (PPO) and POPOP.

When a sensor circuit includes at least one transistor containing an oxide semiconductor in addition to the transistor 10, the sensor circuit preferably includes a light-blocking film above and/or below the transistor. The light-blocking film preferably includes a region overlapping with the transistor or one or all of the transistors, in which case the transistor can be prevented from being irradiated with light, and change in the transistor characteristics can be prevented.

Note that this embodiment can be combined with any of the matters disclosed in this specification and the like as appropriate.

Embodiment 11

In this embodiment, a structure example of a module will be described.

Figure 25:
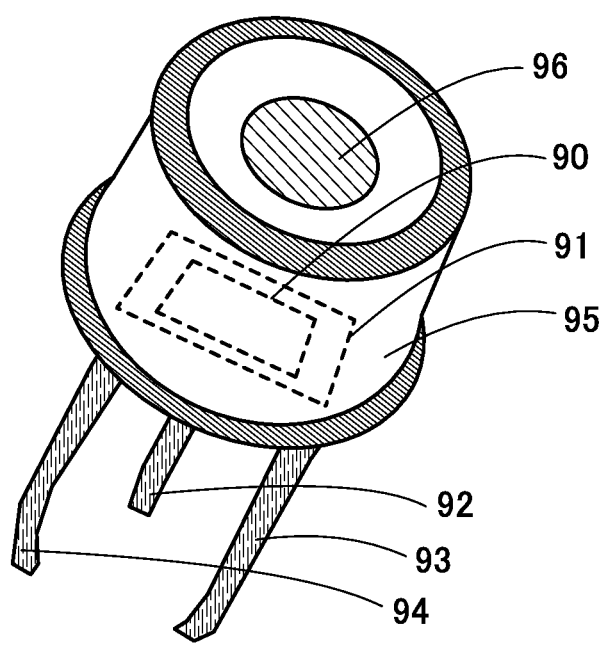
FIG. 25 illustrates a module.

A module in which a sensor circuit is packaged to be protected from environmental conditions such as heat, pressure, and oscillation is included in the category of the semiconductor device of one embodiment of the present invention. FIG. 25 illustrates an example of the structure of a module including a sensor circuit 90 of one embodiment of the present invention.

In the module illustrated in FIG. 25, the sensor circuit 90 is mounted on an interposer 91 by wire bonding or the like. The interposer 91 is electrically connected to terminals 92 to 94. The sensor circuit 90 and the interposer 91 are installed in a housing 95. The housing 95 is provided with a window 96 that transmits light, particularly ultraviolet light. The housing 95 except the window 96 is preferably formed of a material that prevents transmission of light, particularly ultraviolet light. The window 96 may be provided with an optical system such as a lens that collects light into the sensor circuit 90. The terminals 92 to 94 to which the interposer 91 is connected are partly led out from the housing 95 as illustrated in FIG. 25.

Note that this embodiment can be combined with any of the matters disclosed in this specification and the like as appropriate.

Embodiment 12

In this embodiment, examples of electronic devices will be described.

Figure 26A:
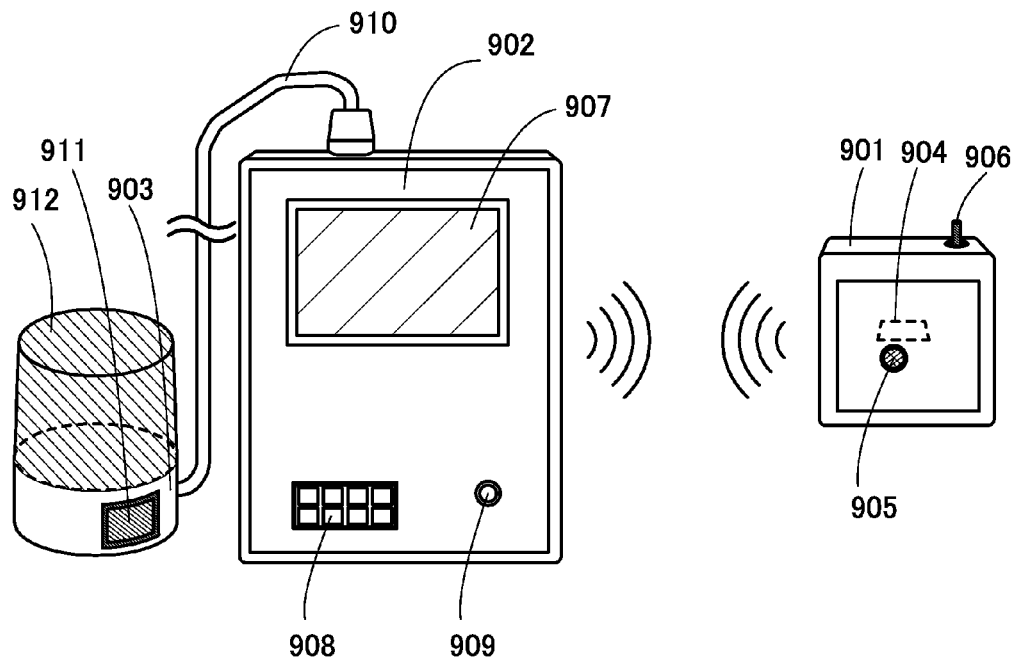
FIGS. 26A to 26C illustrate electronic devices.
Figure 26B:
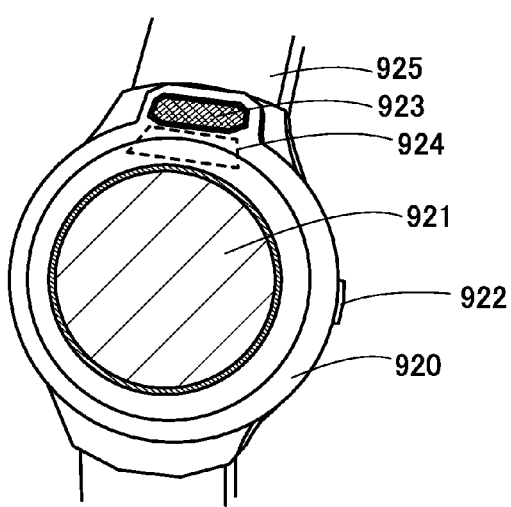
Figure 26C:
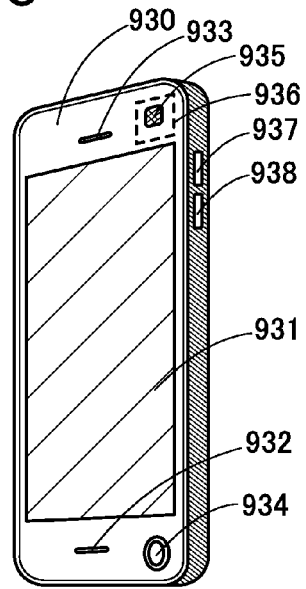

The semiconductor device of one embodiment of the present invention can be used for display devices, personal computers, image reproducing devices provided with recording media (typically, devices that reproduce the content of recording media such as digital versatile discs (DVDs) and have displays for displaying the reproduced images), or the like. Other examples of electronic devices that can be equipped with the semiconductor device of one embodiment of the present invention are mobile phones, game machines including portable game consoles, portable information appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 26A to 26C illustrate specific examples of these electronic devices.

FIG. 26A illustrates a fire alarm system that includes a detector 901, a fire alarm control panel 902, and a notification appliance 903.

The detector 901 includes a sensor circuit 904 of one embodiment of the present invention, a window 905, an operation key 906, and the like. The sensor circuit 904 is irradiated with light passing through the window 905. The sensor circuit 904 detects ultraviolet light emitted from a heat source such as a fire. When the sensor circuit 904 detects ultraviolet light having a radiant intensity exceeding a predetermined value, the detector 901 transmits the information to the fire alarm control panel 902. The fire alarm control panel 902 includes a display portion 907, operation keys 908, an operation key 909, a wiring 910, and the like. The fire alarm control panel 902 controls the operation of the notification appliance 903 in accordance with information transmitted from the detector 901. The notification appliance 903 includes a speaker 911, a lighting device 912, and the like. The notification appliance 903 has a function of raising an alarm in accordance with a command from the fire alarm control panel 902. In FIG. 26A, the notification appliance 903 raises an alarm using warning sound from the speaker 911 and warning light (e.g., red light) from the lighting device 912; alternatively, the notification appliance 903 may give an alarm using any one of sound and light or another means.

The fire alarm control panel 902 may command fire preventive equipment such as a shutter to perform a predetermined operation when an alarm is given. Although FIG. 26A illustrates an example where signals are wirelessly transmitted and received between the fire alarm control panel 902 and the detector 901, signals may be transmitted and received via a wiring or the like. In addition, although FIG. 26A illustrates an example where a signal is transmitted from fire alarm control panel 902 to the notification appliance 903 via the wiring 910, a signal may be wirelessly transmitted.

FIG. 26B illustrates a wristwatch that includes a housing 920, a display portion 921, an operation button 922, a window 923, a sensor circuit 924, a bracelet 925, and the like. The sensor circuit 924 is irradiated with light passing through the window 923.

FIG. 26C illustrates a mobile phone that includes a housing 930, a display portion 931, a microphone 932, a speaker 933, a camera 934, a window 935, a sensor circuit 936, an operation button 937, and a button 938. The sensor circuit 936 is irradiated with light passing through the window 935.

Note that this embodiment can be combined with any of the matters disclosed in this specification and the like as appropriate.

This application is based on Japanese Patent Application serial No. 2013-187041 filed with Japan Patent Office on Sep. 10, 2013, the entire contents of which are hereby incorporated by reference.

What is claimed is:

1. A semiconductor device comprising:
a first transistor;
a capacitor;
an operational amplifier; and
a resistor,
wherein the first transistor comprises an oxide semiconductor film comprising a channel formation region,
wherein one of a source and a drain of the first transistor is electrically connected to an inverting input terminal of the operational amplifier,
wherein a first terminal of the resistor is electrically connected to the inverting input terminal of the operational amplifier,
wherein a second terminal of the resistor is electrically connected to an output terminal of the operational amplifier,
wherein a first terminal of the capacitor is electrically connected to the inverting input terminal of the operational amplifier, and
wherein a second terminal of the capacitor is electrically connected to the output terminal of the operational amplifier.

2. The semiconductor device according to claim 1,
wherein a first signal is input to the other of the source and the drain of the first transistor,
wherein a second signal is input to a gate of the first transistor, and
wherein a first potential is input to a non-inverting input terminal of the operational amplifier.

3. The semiconductor device according to claim 2,
wherein the first signal comprises a potential lower than the first potential and a potential equal to the first potential.

4. The semiconductor device according to claim 2,
wherein in a first period, a potential of the first signal is lower than a potential of the second signal, and
wherein in a second period, the potential of the first signal is higher than the potential of the second signal.

5. The semiconductor device according to claim 1,
wherein the operational amplifier comprises a second transistor, and
wherein a channel width of the first transistor is larger than a channel width of the second transistor.

6. The semiconductor device according to claim 1, further comprising a scintillator,
wherein the scintillator is configured to convert light including X-rays into ultraviolet light, and
wherein the ultraviolet light is emitted to the first transistor.

7. A semiconductor device comprising:
a first transistor;
a second transistor;
a first capacitor;
a first switch;
a second switch;
a third switch;
an operational amplifier; and
a resistor,
wherein the first transistor comprises an oxide semiconductor film comprising a channel formation region,
wherein one of a source and a drain of the first transistor is electrically connected to an inverting input terminal of the operational amplifier,
wherein a first terminal of the resistor is electrically connected to the inverting input terminal of the operational amplifier,
wherein a second terminal of the resistor is electrically connected to an output terminal of the operational amplifier,
wherein one of a source and a drain of the second transistor is electrically connected to the other of the source and the drain of the first transistor, wherein a gate of the second transistor is electrically connected to the one of the source and the drain of the second transistor, wherein a first terminal of the first capacitor is electrically connected to the other of the source and the drain of the first transistor, wherein the first switch is electrically connected to a gate of the first transistor, wherein the second switch is electrically connected to a second terminal of the first capacitor, and wherein the gate of the first transistor is electrically connected to the second terminal of the first capacitor via the third switch.

8. The semiconductor device according to claim 7, further comprising a second capacitor, wherein a first terminal of the second capacitor is electrically connected to the inverting input terminal of the operational amplifier, and wherein a second terminal of the second capacitor is electrically connected to the output terminal of the operational amplifier.

9. The semiconductor device according to claim 7, wherein the operational amplifier comprises a third transistor, and wherein a channel width of the first transistor is larger than a channel width of the third transistor.

10. The semiconductor device according to claim 7, further comprising a scintillator, wherein the scintillator is configured to convert light including X-rays into ultraviolet light, and wherein the ultraviolet light is emitted to the first transistor.

* * * * *